United States Patent
Asai et al.

(10) Patent No.: US 9,735,323 B2
(45) Date of Patent: Aug. 15, 2017

(54) LIGHT EMITTING DEVICE HAVING A TRIPLE PHOSPHOR FLUORESCENT MEMBER

(71) Applicant: NICHIA CORPORATION, Anan-shi, Tokushima (JP)

(72) Inventors: Kenji Asai, Naruto (JP); Hiroyuki Watanabe, Tokushima (JP); Shoji Hosokawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/196,964

(22) Filed: Jun. 29, 2016

(65) Prior Publication Data

US 2017/0005239 A1 Jan. 5, 2017

(30) Foreign Application Priority Data

Jun. 30, 2015 (JP) .................................. 2015-131148
Jun. 23, 2016 (JP) .................................. 2016-124354

(51) Int. Cl.
*H01L 33/50* (2010.01)
*C09K 11/00* (2006.01)

(52) U.S. Cl.
CPC ............ *H01L 33/504* (2013.01); *C09K 11/00* (2013.01)

(58) Field of Classification Search
CPC .................................................... H01L 33/504
See application file for complete search history.

(56) References Cited

U.S. PATENT DOCUMENTS

| 4,135,113 | A  | * | 1/1979  | Tsuneta   | H01J 9/2278  |
|           |    |   |         |           | 313/470      |
| 7,138,660 | B2 | * | 11/2006 | Ota       | B82Y 20/00   |
|           |    |   |         |           | 257/79       |
| 7,611,641 | B2 | * | 11/2009 | Schmidt   | C04B 35/584  |
|           |    |   |         |           | 252/301.4 F  |
| 7,750,359 | B2 | * | 7/2010  | Narendran | B82Y 10/00   |
|           |    |   |         |           | 257/98       |
| 7,897,987 | B2 | * | 3/2011  | Inoue     | H01L 33/504  |
|           |    |   |         |           | 257/100      |
| 7,990,045 | B2 | * | 8/2011  | Zukauskas | H01L 33/504  |
|           |    |   |         |           | 313/501      |

(Continued)

FOREIGN PATENT DOCUMENTS

| JP | 2003-535477 A | 11/2003 |
| JP | 2003-535478 A | 11/2003 |

(Continued)

*Primary Examiner* — Ida M Soward
(74) *Attorney, Agent, or Firm* — Andrews Kurth Kenyon LLP

(57) ABSTRACT

A light emitting device includes a light emitting element of a peak emission wavelength in a range of 430 nm to 470 nm and a fluorescent member. The fluorescent member includes a first phosphor including a silicate having a composition that contains at least one element selected from the group consisting of Ca, Sr, and Ba, at least one element selected from the group consisting of Cl, F, and Br, and Mg and Eu, a second phosphor including an aluminate that has a composition containing Lu and Ce, and a third phosphor having emission spectrum with a half bandwidth of 86 nm or less and including a silicon nitride that has a composition containing at least one of Sr or Ca, and containing Al and Eu.

12 Claims, 14 Drawing Sheets

(56) References Cited

U.S. PATENT DOCUMENTS

| | | | |
|---|---|---|---|
| 8,084,934 B2* | 12/2011 | Kim | C09K 11/025 313/501 |
| 8,277,687 B2* | 10/2012 | Takahashi | C09K 11/584 252/301.4 H |
| 8,404,153 B2* | 3/2013 | Comanzo | C09K 11/663 252/301.4 F |
| 8,508,117 B2* | 8/2013 | Negley | H01L 33/504 313/501 |
| 8,704,440 B2* | 4/2014 | Zheng | C09K 11/0883 313/501 |
| 8,916,887 B2* | 12/2014 | Kim | H01L 33/50 257/88 |
| 9,028,718 B2* | 5/2015 | Kijima | C09K 11/661 252/301.4 F |
| 9,142,732 B2* | 9/2015 | Luo | H01L 33/504 |
| 9,281,456 B2* | 3/2016 | Masuda | C09K 11/0883 |
| 9,537,060 B2* | 1/2017 | Yoon | H01L 33/504 |
| 2009/0194781 A1* | 8/2009 | Harada | C09K 11/025 257/98 |
| 2009/0224177 A1* | 9/2009 | Kinomoto | C09K 11/7721 250/484.4 |
| 2009/0231832 A1* | 9/2009 | Zukauskas | H01L 33/504 362/84 |
| 2012/0306356 A1* | 12/2012 | Yoon | C04B 35/597 313/503 |
| 2013/0002124 A1* | 1/2013 | Izumi | H01L 33/504 313/498 |
| 2013/0033167 A1* | 2/2013 | Dong | C09K 11/0883 313/498 |
| 2013/0120967 A1* | 5/2013 | Liao | H01L 33/486 362/97.1 |
| 2014/0008680 A1* | 1/2014 | Won | C09K 11/0883 257/98 |
| 2015/0014725 A1* | 1/2015 | Hong | C09K 11/7721 257/98 |
| 2015/0152327 A1* | 6/2015 | Inoue | H01L 33/502 257/98 |
| 2015/0153010 A1* | 6/2015 | Okuyama | F21K 9/56 362/510 |
| 2016/0218255 A1* | 7/2016 | Kim | H01L 33/504 |

FOREIGN PATENT DOCUMENTS

| | | | |
|---|---|---|---|
| JP | 2006253336 A | * | 9/2006 |
| JP | 2015-113358 A | | 6/2015 |
| JP | 2015-142056 A | | 8/2015 |
| JP | 2015-163689 A | | 9/2015 |
| WO | 2010-098141 A1 | | 9/2010 |
| WO | 2015-002139 A1 | | 1/2015 |

* cited by examiner

LIGHT EMITTING DEVICE HAVING A TRIPLE PHOSPHOR FLUORESCENT MEMBER

CROSS-REFERENCE TO RELATED PATENT APPLICATIONS

The present application claims priority to Japanese Patent Application No. 2015-131148, filed on Jun. 30, 2015, and Japanese Patent Application No. 2016-124354, filed on Jun. 23, 2016, the entire disclosures of which are incorporated by reference herein.

BACKGROUND

Technical Field

The present disclosure relates to a light emitting device.

Description of Related Art

Light emitting devices using light emitting elements which are called light emitting diodes (hereinafter may be referred to as "LEDs") have been attracting attention. Various types of light emitting devices that use LEDs to emit white light have known. Examples thereof include light emitting devices using combinations of LEDs to emit blue light and phosphors to emit yellow light. Such light emitting device are configured to emit white light that is a mixture of blue light emitted by blue LEDs and yellow light emitted by phosphors that emit light upon being excited by the blue light. Such light emitting devices also have good color mixing properties and thus used in a wide range of fields. Examples thereof include three-wavelength type light emitting devices in which combinations of blue LEDs, green LEDs, and red LEDs are used. Such light emitting devices are configured to emit white light that is a mixture of the lights emitted by three different colors of light emitting diodes. Such light emitting devices have the LEDs with emission spectra of sharp emission peaks and exhibit good matching with color filters of liquid crystal displays, wide color reproduction ranges, and high luminous efficiency.

In the case of light emitting devices in which light emitting elements to emit blue light and phosphors to emit yellow light are used in combination, high radiant intensity and high luminous efficiency can be obtained in visible light range, but sufficient radiant intensity in blue-green range and red range may not be obtained. For this reason, further improvement in average color rendering index that is an index of visual perception in color of an irradiated object (color rendering property) has been desired. Also, in a three-wavelength type light emitting device employing three LEDs of different colors, due to sharp emission peaks of respective LEDs, sufficient color mixing and continuous emission spectrum are difficult to obtain, and thus, higher color rendering properties may be difficult to be achieved.

Relating to the above, light emitting devices employing an LED to emit blue light and two different phosphors to emit light in a range of yellow to green range have been disclosed and referred to as devices capable of achieving high degree of color reproductivity (for example, see published Japanese translations of PCT international publications for patent applications No. 2003-535477 and No. 2003-535478).

SUMMARY

A light emitting device that can achieve high luminous efficiency and high color rendering properties at the same time can be provided. The light emitting device includes a light emitting element of a peak emission wavelength in a range of 430 nm to 470 nm and a fluorescent member. The fluorescent member includes a first phosphor, a second phosphor and a third phosphor. The first phosphor includes a silicate having a composition that contains at least one element selected from the group consisting of Ca, Sr, and Ba, at least one element selected from the group consisting of Cl, F, and Br, and Mg and Eu. The second phosphor includes an aluminate that has a composition containing Lu and Ce. The third phosphor has emission spectrum with a half bandwidth of 86 nm or less and includes a silicon nitride that has a composition containing at least one of Sr or Ca, and containing Al and Eu.

DETAILED DESCRIPTION

Figure 1:
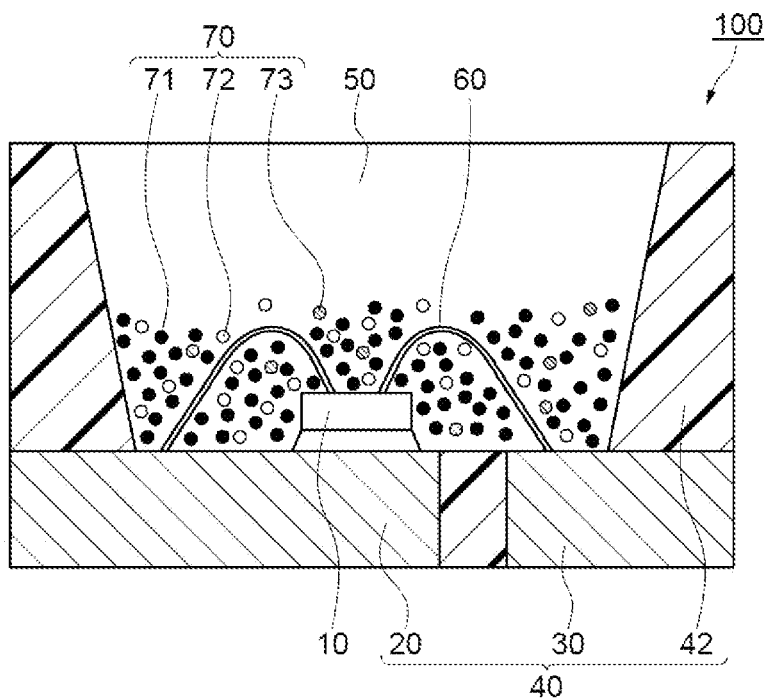
FIG. 1 is a schematic cross-sectional view showing an example of light emitting device according to one embodiment.

Hereinafter, embodiments of light emitting devices according to the present disclosure will be described. The following embodiments are intended as illustrative of light emitting devices to give concrete forms to technical ideas of the present invention, and the scope of the invention is not limited to those described below.

The relation between the color names and the chromaticity coordinates, the relation between the range of wavelength of light and the color name of single color light, and the like conform to JIS Z8110. In the present specification, the "content of each component in the composition" refers, in the case where different substances that correspond to one component are present in the composition, to a total amount of the different substances in the composition, unless specifically indicated. The average particle size of a phosphor can be determined as a Fisher number measured by using a Fisher Sub-Sieve Sizer that employs an air permeable method.

Light Emitting Device

A light emitting device includes a light emitting element of a peak emission wavelength in a range of 430 nm to 470 nm and a fluorescent member. The fluorescent member includes a first phosphor, a second phosphor and a third phosphor. The first phosphor includes a silicate having a composition that contains at least one element selected from the group consisting of Ca, Sr, and Ba, at least one element selected from the group consisting of Cl, F, and Br, and also contains Mg and Eu. The second phosphor includes an aluminate that has a composition that contains Lu and Ce. The third phosphor has emission spectrum with a half width of 86 nm or less and includes a silicon nitride that has a composition that contains at least one of Sr and Ca, and also contains Al, and Eu.

With the use of the first phosphor to emit green light in addition to the light emitting element to emit blue-purple to blue light in a peak wavelength range of 430 nm to 470 nm, the second phosphor to emit yellow light, and the third phosphor to emit red light, continuity in emission spectrum can be improved while maintaining the light emission intensity in the visible light range. With this arrangement, high luminous efficiency and high color rendering properties can be achieved at the same time.

International Commission on Illumination (CIE) published in 1986, a guide for the color rendering properties that fluorescent lamps have to provide. According to the guide, preferable average color rendering index (hereinafter may be referred to as "Ra") for the locations of use is indicated such and the like, 80 or more to less than 90 in residents, hotels, restaurants, shops, offices, schools, hospitals, factories for precision work, and the like, 90 or more in places for clinical examination, museums, and the like, requiring high color rendering properties.

The light emitting device exhibits excellent color rendering properties. More specifically, the light emitting device has an Ra of 80 or greater, 90 or greater, or 95 or greater. The maximum value of Ra is 100. Special color rendering indices are represented by R9 to R15, and of those, R9 is to specify the visibility of high-chroma red. In the environment where meat is handled, attention is often directed to the special color rendering index R9 of the lighting devices, where the higher the index value be more preferable. The light emitting device according to the present embodiment has R9 of, for example, 30 or greater, 35 or greater, 40 or greater or 50 or greater. The maximum value of R9 is 100.

The light emitting device emits light of mixed color of light emitted by a light emitting element and fluorescent light emitted by the first phosphor, the second phosphor, and the third phosphor. For example, with respect to the chromaticity coordinates determined in CIE1931, the mixed light can be adjusted in a range of x=0.00 to 0.50 and y=0.00 to 0.50, or in a range of x=0.33 to 0.50 and y=0.33 to 0.45. The light emitting device can be adjusted to emit light of correlated color temperature of 2500K or greater, 2700K or greater, or 3500K or greater, for example. The correlated color temperature of the light can be adjusted to 5000 K or less, or 4500 K or less, for example.

The configuration of the light emitting device can be appropriately selected from configurations which are generally employed. Examples of the type of the light emitting device include a pin-through type and a surface-mounted type. The "pin-through type" light emitting device generally refers that a light emitting device is fixed to a mounting substrate that defines a through hole by a lead (pin) of the light emitting device penetrating the through hole. The "surface-mounted type" generally refers that the lead of the light emitting device is fixed on the mounting substrate.

The embodiments according to the present invention will be described below with reference to the drawings. FIG. 1 is a schematic cross-sectional view showing a structure of a light emitting device 100. The light emitting device 100 is an example of a surface-mounted type light emitting device. The light emitting device 100 includes a light emitting element 10 (light source) which is a gallium nitride-based compound semiconductor to emit a short-wavelength visible light (for example, 380 nm to 485 nm), and a molded body 40 where the light emitting element 10 is mounted. The molded body 40 is formed by integrally molding a first lead 20 and a second lead 30 with a resin part 42 that contains thermoplastic resin or thermosetting resin. The molded body 40 may be formed with ceramics member instead of the resin portion 42 by using known method. A recess defined by a bottom surface and one or more side surfaces is formed in the molded body 40 and the light emitting element 10 is mounted on the bottom surface defining the recess. The light emitting element 10 has a pair of positive and negative electrodes and the pair of electrodes is respectively electrically connected with the first lead 20 and the second lead 30 through respective wires 60. The light emitting element 10 is covered by a fluorescent member 50. The fluorescent member 50 contains, for example, a first phosphor 71, a second phosphor 72, and a third phosphor 73 as the phosphor to wavelength converting the light from the light emitting element 10.

The fluorescent member 50 can be formed by filling the recess defined in the molded body 40 with a light-transmissive resin and/or glass to cover the light emitting element 10 mounted in the recess. In view of the ease of manufacturing, a light-transmissive resin is preferable for the material of the fluorescent member. For the light-transmissive resin, a silicone resin composition is preferably used, but an insulating resin composition such as an epoxy resin composition or an acrylic resin composition can also be used. The first phosphor 71, the second phosphor 72, and the third phosphor 73 are contained in the fluorescent member 50, and further, an additional member can be appropriately contained in the fluorescent member 50. For example, with a light diffusion agent contained in the fluorescent member 50, the directivity of light from the light emitting element can be relaxed, allowing an expansion of the viewing angle.

The fluorescent member 50 encloses the first phosphor 71, the second phosphor 72, and the third phosphor 73 and serves as a wavelength converting member, and also serves as a protective member to protective those enclosed therein and the light emitting element 10. In the example shown in FIG. 1, the first phosphor 71, the second phosphor 72, and the third phosphor 73 are locally distributed in the fluorescent member 50. Arranging the first phosphor 71, the second phosphor 72, and the third phosphor 73 close to the light emitting element 10 allows efficient wavelength conversion of light from the light emitting element 10, and a light emitting device having excellent luminous efficiency can be obtained. The relative arrangement between the first phosphor 71, the second phosphor 72, and the third phosphor 73 and the light emitting element 10 is not limited to that in which the both are disposed closely. In view of thermal effect on the phosphor, the light emitting element and the wavelength converting member which contains the phosphor can be arranged spaced apart from each other. Also, the first phosphor 71, the second phosphor 72, and the third phosphor 73 can be distributed approximately uniformly in the whole portion of the fluorescent member 50, which allows obtaining light in which color-unevenness can be further reduced.

Figure 2:
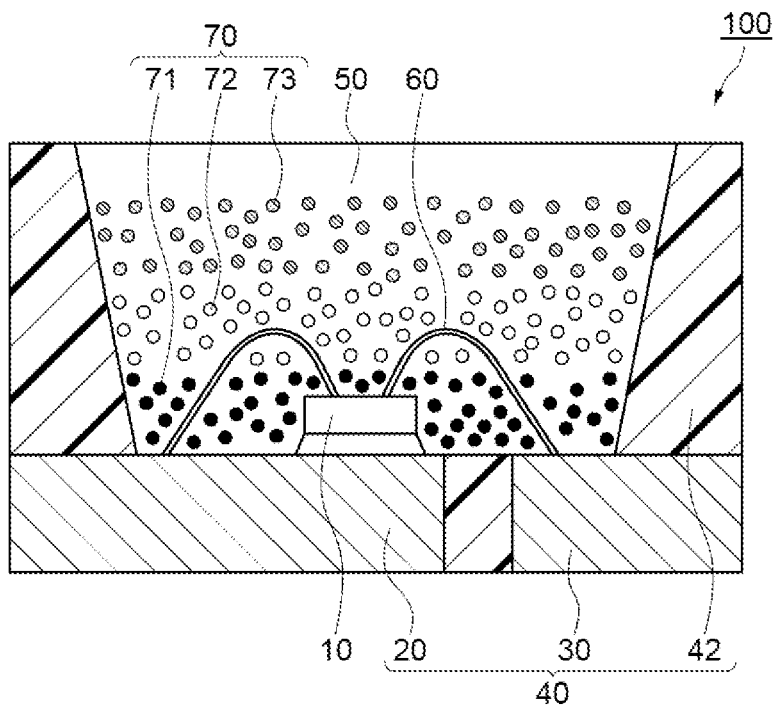
FIG. 2 is a schematic cross-sectional view showing an example of light emitting device according to other embodiment.

In the example shown in FIG. 1, the first phosphor 71, the second phosphor 72, and the third phosphor 73 are shown mixed with each other, but the respective phosphors can be arranged as shown in FIG. 2. FIG. 2 is a schematic cross-sectional view showing other example of light emitting device according to the present embodiment. In the example shown in FIG. 2, the third phosphor 73, the second phosphor 72, and the first phosphor 71 are in this order arranged closer to the light emitting element 10. With this arrangement, excitation of the third phosphor 73 by the light emitted from the first phosphor 71 and the second phosphor 72 can be avoided. Also, arranging the first phosphor 71 at a topmost of the phosphors can facilitate extracting of the light emitted from the first phosphor to the outside.

Light Emitting Element

The light emitting element may have a peak emission wavelength in a range of 430 nm to 470 nm, or in a range of 445 nm and 455 nm for luminous efficiency. The use of a light emitting element that has a peak emission wavelength in the range shown above as an excitation light source allows for obtaining of a light emitting device to emit light of mixed color of the light emitted from the light emitting element and fluorescent light emitted from the phosphors. Further, light emitted from the light emitting element to the outside can be used efficiently, so that loss of light emitted from the light emitting device can be reduced, and the light emitting device of high efficiency can be obtained.

The half bandwidth of the light emitting element can be 30 nm or less, for example. For the light emitting element, a semiconductor light emitting element such as an LED can be used. With the use of a semiconductor light emitting element as a light source, a light emitting device having a high linearity of outputting to inputting in high efficiency and having high stability to mechanical impacts can be obtained. For example, a light emitting element for emitting light of a blue color or a green color, a nitride-based semiconductor ($In_XAl_YGa_{1-X-Y}N$, $0 \leq X$, $0 \leq Y$, $X+Y \leq 1$) etc., can be used.

Phosphor

The fluorescent member that constitutes the light emitting device includes at least one first phosphor to emit green light, at least one second phosphor to emit yellow light, and at least one phosphor to emit red light, respectively upon absorbing the light emitted from the light emitting element. The first phosphor, the second phosphor, and the third phosphor have specific compositions respectively. The characteristics of the light emitting device such as the luminous efficiency and the color rendering properties can be adjusted in a desired range by appropriately selecting the composition ratio of the first phosphor, the second phosphor, and the third phosphor.

First Phosphor

The first phosphor includes silicate having a composition that contains at least one element selected from the group consisting of Ca, Sr, and Ba, at least one element selected from the group consisting of Cl, F, and Br, and also contains Mg and Eu. The first phosphor may have a composition represented by formula (I) shown below.

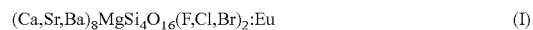
$$(Ca,Sr,Ba)_8MgSi_4O_{16}(F,Cl,Br)_2:Eu \qquad (I)$$

The first phosphor contains at least one element selected from the group consisting of Ca, Sr, and Ba, in which at least Ca may be contained, or of Ca, Sr, and Ba, 90 mol % or greater Ca may be contained. The first phosphor contains at least one element selected from the group consisting of F, Cl, and Br, in which at least Cl may be contained, or of F, Cl, and Br, 90 mol % or greater Cl may be contained.

The first phosphor may have a maximum excitation wavelength preferably in a range of 220 nm to 500 nm, or in a range of 300 nm to 470 nm. The first phosphor may have a peak emission wavelength in a range of 490 nm to 590 nm, or in a range of 500 nm to 540 nm. The first phosphor may have a half bandwidth of the emission spectrum, for example, in a range of 85 nm to 115 nm, or in a range of 95 nm to 105 nm.

The first phosphor may have an appropriate average particle diameter, for example, in a range of 5 μm to 20 μm, or in a range of 10 μm to 15 μm. The light emitting device may include the first phosphor of one composition or a combination of two or more different compositions.

In view of luminous efficiency and color rendering properties, the percentage content of the first phosphor with respect to the total content of the phosphors in the light emitting device can be, for example, 1 mass % or greater, 1.5 mass % or greater, or 3 mass % or greater. Also, in view of luminous efficiency and color rendering properties, the percentage content of the first phosphor with respect to the total content of the phosphors in the light emitting device can be, for example, 20 mass % or less, 15 mass % or less, or 8 mass % or less.

Second Phosphor

The second phosphor contains an aluminate having a composition that contains Lu and Ce. The second phosphor may have a composition represented by formula (II) shown below.

$$Lu_3Al_5O_{12}:Ce \qquad (II)$$

The second phosphor may have a maximum excitation wavelength in a range of 220 nm to 490 nm, or in a range of 430 nm to 470 nm. The second phosphor may have a peak emission wavelength in a range of 480 nm to 630 nm, or in a range of 500 nm to 560 nm. The first phosphor may have a half bandwidth of the emission spectrum, for example, in a range of 53 nm to 73 nm, or in a range of 58 nm to 68 nm.

The first phosphor may have an appropriate average particle diameter, for example, in a range of 5 μm to 30 μm, or in a range of 20 μm to 25 μm. The light emitting device may include the second phosphor of one composition or a combination of two or more different compositions.

In view of luminous efficiency and color rendering properties, the percentage content of the second phosphor with respect to the total content of the phosphors in the light emitting device can be, for example, 70 mass % or greater, 75 mass % or greater, or 80 mass % or greater. Also, in view of luminous efficiency and color rendering properties, the percentage content of the second phosphor with respect to the total content of the phosphors in the light emitting device can be, for example, 95 mass % or less, 93 mass % or less, or 90 mass % or less.

Third Phosphor

The third phosphor includes a silicon nitride having a composition that contains at least one of Sr and Ca, and also contains Al and Eu. The third phosphor may have a composition represented by formula (III) shown below.

(Sr,Ca)AlSiN$_3$:Eu                    (III)

The third phosphor contains at least one element selected from the group consisting of Sr and Ca, in which both Sr and Ca may be contained, or, of Sr and Ca, 0.8 mole% or greater Sr may be contained.

The third phosphor may have a maximum excitation wavelength in a range of 220 nm to 570 nm, or in a range of 400 nm to 490 nm. The third phosphor may have a peak emission wavelength in a range of 550 nm to 700 nm, or in a range of 610 nm to 650 nm. The third phosphor may have a half bandwidth of the emission spectrum, for example, in a range of 76 nm to 86 nm, in a range of 78 nm to 84 nm, or in a range of 80 nm to 82 nm.

The third phosphor may have an appropriate average particle diameter, for example, in a range of 5 μm to 15 μm, or in a range of 8 μm to 12 μm. The light emitting device may include the third phosphor of one composition or a combination of two or more different compositions.

In view of luminous efficiency and color rendering properties, the percentage content of the third phosphor with respect to the total content of the phosphors in the light emitting device can be, for example, 3.5 mass % or greater, 4 mass % or greater, or 4.5 mass % or greater. Also, in view of luminous efficiency and color rendering properties, the percentage content of the third phosphor with respect to the total content of the phosphors in the light emitting device can be, for example, 10 mass % or less, 9 mass % or less, or 8 mass % or less.

In the phosphors included in the light emitting device, the content ratio of the first phosphor to the second phosphor (first phosphor/second phosphor) can be appropriately selected according to desired emission characteristics. In view of luminous efficiency and the color rendering properties, the content ratio of the first phosphor to the second phosphor can be, for example, in a range of 1.5 to 9, 3 to 9, or 5 to 9 for luminous efficiency and the color rendering properties, when the content of the second phosphor is set to 100. Also, the content ratio of the first phosphor to the third phosphor (first phosphor/third phosphor) can be, for example, in a range of 25 to 120, 30 to 110, or 40 to 100 for luminous efficiency and the color rendering properties, when the content of the third phosphor is set to 100.

The light emitting device can emit light in a wide range of correlated color temperature. In the case where the correlated color temperature is in a range of 2,600K to 3,250 K, at least one of the conditions below may be satisfied:

(1a) The percentage content of the first phosphor with respect to the total content of the phosphors is 3 mass % to 15 mass %, or in a range of 5 mass % to 7.5 mass %.

(1b) The percentage content of the third phosphor with respect to the total content of the phosphors is 6 mass % to 10 mass %, or in a range of 7 mass % to 8 mass %.

(1c) The content ratio of the first phosphor to the second phosphor is in a range of 3 to 20, or in a range of 5 to 10, when the content of the second phosphor is set to 100.

(1d) The content ratio of the first phosphor to the third phosphor is in a range of 40 to 160, or in a range of 70 to 100, when the content of the third phosphor is set to 100.

In the case where the correlated color temperature is in a range of 3,250 K to 3,750 K, at least one of the conditions below may be satisfied:

(2a) The percentage content of the first phosphor with respect to the total content of the phosphors is in a range of 1.5 mass % to 10 mass %, or in a range of 3 mass % to 7.5 mass %.

(2b) The percentage content of the third phosphor with respect to the total content of the phosphors is in a range of 5 mass % to 8 mass %, or in a range of 5.5 mass % to 7 mass %.

(2c) The content ratio of the first phosphor to the second phosphor is in a range of 1 to 15, or in a range of 3 to 9, when the content of the second phosphor is set to 100.

(2d) The content ratio of the first phosphor to the third phosphor is in a range of 25 to 130, or in a range of 50 to 100, when the content of the third phosphor is set to 100.

In the case where the correlated color temperature is in a range of 3,750 K to 4,250 K, at least one of the conditions below may be satisfied:

(3a) The percentage content of the first phosphor with respect to the total content of the phosphors is in a range of 1.5 mass % to 10 mass %, or in a range of 3 mass % to 5 mass %.

(3b) The percentage content of the third phosphor with respect to the total content of the phosphors is in a range of 4 mass % to 8 mass %, or in a range of 5 mass % to 6 mass %.

(3c) The content ratio of the first phosphor to the second phosphor is in a range of 1 to 13, or in a range of 3 to 6, when the content of the second phosphor is set to 100.

(3d) The content ratio of the first phosphor to the third phosphor is in a range of 30 to 150, or in a range of 50 to 100, when the content of the third phosphor is set to 100.

In the case where the correlated color temperature is in a range of 4,250 K to 5,250 K, at least one of the conditions below may be satisfied:

(4a) The percentage content of the first phosphor with respect to the total content of the phosphors is in a range of 1.5 mass % to 10 mass %, or in a range of 1.5 mass % to 3 mass %.

(4b) The percentage content of the third phosphor with respect to the total content of the phosphors is in a range of 3 mass % to 7 mass %, or in a range of 3.5 mass % to 4.5 mass %.

(4c) The content ratio of the first phosphor to the second phosphor is in a range of 1 to 15, or in a range of 1.5 to 3.5, when the content of the second phosphor is set to 100.

(4d) The content ratio of the first phosphor to the third phosphor is in a range of 30 to 160, or in a range of 35 to 70, when the content of the third phosphor is set to 100.

Other Phosphors

When needed, the light emitting device may contain one or more phosphors other than the first phosphor, the second phosphor, and the third phosphor. Examples of other phosphors include (Y,Gd,Tb,Lu)$_3$(Al,Ga)$_5$O$_{12}$:Ce, Ca$_3$Sc$_2$Si$_3$O$_{12}$:Ce, CaSc$_2$O$_4$:Ce, (La,Y)$_3$Si$_6$N$_{11}$:Ce, (Ca,Sr,Ba)$_3$Si$_6$O$_9$N$_4$:Eu, (Ca,Sr,Ba)$_3$Si$_6$O$_{12}$N$_2$:Eu, (Ba,Sr,Ca)Si$_2$O$_2$N$_2$:Eu, (Sr,Ca)AlSiN$_3$:Eu, (Ca,Sr,Ba)$_2$Si$_5$N$_8$:Eu, (Ca,Sr,Ba)S:Eu, (Ba,Sr,Ca)Ga$_2$S$_4$:Eu, and K$_2$(Si,Ti,Ge)F$_6$:Mn. In the case where the light emitting device includes one or more other phosphors, the contents thereof can be, for example, 10 mass % or less with respect to the total content of the phosphors.

The method of manufacturing each phosphor can be appropriately selected from known methods. For example, the phosphors can be manufactured as shown below. Raw materials of each phosphor that may be a single element, an oxide, a carbonate, a nitride, a chloride, a fluoride, a sulfide, or the like, of elements contained in a target phosphor composition are respectively weighed according to a predetermined composition ratio. Further, an appropriate amount of one or more additional materials such as flux is added to the raw materials and mixed using a mixing machine in a wet or dry condition. With this, solid reaction can be accelerated and particles of substantially uniform size can be formed. For the mixing machine, a ball mill generally used in the industry can be employed, and other than that, a pulverizing machine such as a vibration mill, a roll mill, or a jet mill may also be used. Pulverizing by using a pulverizing machine provides a powder, so that specific surface area can be increased. In order to obtain a certain range of specific surface area, the powder can be classified by using a wet separating device such as a settling tank, a hydrocyclone, or a centrifugal separating device, or a dry separating device such as a cyclone separating device, or an air separating device, those commonly used in the industry. The mixed raw materials described above is charged in a crucible of, such as SiC, quartz, alumina, or BN, and subjected to calcination in an inert atmosphere such as argon, nitrogen, or in reduction atmosphere. The calcination is carried out at a predetermined temperature for a predetermined length of time. The calcined product is then pulverized, dispersed, filtered, or the like, to obtain a target phosphor power. Solid-liquid separation can be carried out by using a method commonly used in the industry, such as filtering, vacuum filtering, pressure filtering, centrifugating, or decantating. Drying can be carried out by using a device commonly used in the industry, such as a vacuum drying machine, a hot-air heating drying machine, a conical drying machine, or a rotary evaporation machine.

Fluorescent Member

The light emitting device has a fluorescent member that includes, for example, a phosphor and resin, and may cover at least one light emitting element. Examples of the resin included in the fluorescent member include thermoplastic resin and a thermosetting resin. More specific examples of the thermosetting resin include epoxy resin, modified epoxy resin, silicone resin, and modified silicone resin. When needed, the fluorescent member may include one or more components in addition to the phosphors and the resin. Examples of such additional components include a filler material such as silica, barium titanate, titanium oxide, aluminum oxide and the like, an optical stabilizer, and a coloring agent. In the case where the fluorescent member includes one or more other components, the contents thereof can be suitably set according to purpose and the like. For example, in the case of including a filler material as the other component, the content of the filler material can be in a range of 0.01 to 20 pts. by mass with respect to 100 pts. by mass of resin.

EXAMPLES

Next, the present embodiments will be more specifically described with reference to examples, which however are not intended to limit the present embodiments.

Phosphor

Before manufacturing the light emitting device, phosphors shown below were provided for the phosphors of examples and comparative examples, respectively. For the first phosphor, a chlorosilicate phosphor having a composition represented by the formula (Ia) below and to emit green light having a peak emission wavelength of about 521 nm was provided.

$$Ca_8NgSi_4O_{16}Cl_2:Eu \quad (Ia)$$

For the second phosphor, a rare earth-aluminum garnet phosphor (hereinafter may be referred to as "LAG" phosphor) having a composition represented by the formula (II) and to emit light having a peak emission wavelength of about 520 nm was provided.

For the third phosphor, a nitride phosphor (hereinafter may be referred to as "SCASN2" phosphor) having a composition represented by the formula (III) and to emit red light having a peak emission wavelength of about 630 nm and a half band width of 81 nm was provided.

For other phosphors, a rare earth-aluminum garnet phosphor (hereinafter may be referred to as "YAG" phosphor) having a composition represented by the formula (IV) below and to emit yellow light having a peak emission wavelength of about 530 nm and a nitride phosphor (hereinafter may be referred to as "SCASN1" phosphor) having a composition represented by the formula (III) and to emit red light having a peak emission wavelength of about 630 nm and a half band width of 92 nm were provided.

$$Y_3(Al,Ga)_5O_{12}:Ce \quad (IV)$$

The peak emission wavelength, half bandwidth, or the like of each phosphor can be adjusted by changing conditions in manufacturing, compositions, or the like.

For the light emitting element, gallium nitride-based semiconductor light emitting elements having a peak emission wavelength of 445 nm, 449nm, or 455 nm, respectively, were provided.

Example 1

Producing Light Emitting Device

A light emitting device was produced combining a blue LED (light emitting element) having an emission wavelength of 449 nm with a first phosphor of chrolosilicate, a second phosphor of LAG, and a third phosphor of SCASN2. A phosphor containing chlorosilicate with a percentage content of 1.5 mass % with respect to the total content of the phosphors so as to obtain a correlated color temperature of about 4,000 K was added to silicone resin and was mixed and dispersed, and then further defoamed to obtain a phosphor-containing resin composition. Next, the phosphor-containing resin composition was injected to enclose the light emitting element, and heat is applied to harden the resin composition. Thus, a light emitting device was produced.

Examples 2 to 5

Light emitting devices were produced in a similar manner as in Example 1, except that contents of the phosphors were adjusted to satisfy the percentage content ratios shown in Table 1.

Chromaticity coordinates of emission color, correlated color temperature (Tcp:K), average color rendering index (Ra), special color rendering index (R9), and luminous efficiency (1 m/W) of the light emitting devices obtained according to Examples 1 to 5 were measured. The luminous efficiency of each light emitting device was measured by using a total flux integrating sphere, and the emission spectrum of each light emitting device was measured by using a spectrofluorometer model F-4500 manufactured by Hitachi High-Technologies Corporation. The luminous efficiencies and the emission spectra of the light emitting devices according to other examples and comparative examples to be described below were measured in similar manner. The results are shown in Table 1 below. For the luminous efficiency, a relative luminous efficiency with respect to a luminous efficiency (lm/W) of Comparative Example 1 as a base of 100 is shown. "Phosphor Content Ratio" shown in Table 1 is a content of the first phosphor with respect to the content of the second phosphor or the third phosphor as a base of 100.

TABLE 1

|  | Example 1 | Example 2 | Example 3 | Example 4 | Example 5 |
|---|---|---|---|---|---|
| First Phosphor Percentage Content (mass %) | 1.5 | 3.0 | 5.0 | 7.5 | 10.0 |
| Third Phosphor Percentage Content (mass %) | 4.6 | 5.1 | 5.8 | 6.4 | 7.0 |
| Phosphor Content Ratio First Phosphor versus Second Phosphor | 1.6 | 3.3 | 5.6 | 8.7 | 10.8 |
| Phosphor Content Ratio First Phosphor versus Third Phosphor | 32.6 | 55.8 | 86.2 | 117.0 | 143.0 |
| Chromaticity x | 0.384 | 0.381 | 0.380 | 0.387 | 0.387 |
| Coordinates y | 0.380 | 0.377 | 0.375 | 0.376 | 0.375 |
| Correlated Color Temperature (K) | 3915 | 3778 | 3965 | 3790 | 3950 |
| Average Color Rendering Index (Ra) | 90.5 | 92.2 | 93.2 | 94.3 | 95.3 |
| Special Color Rendering Index (R9) | 44.8 | 51.9 | 56.9 | 63.9 | 68.9 |
| Relative Luminous Efficiency | 99 | 98 | 97 | 94 | 94 |

Figure 3:
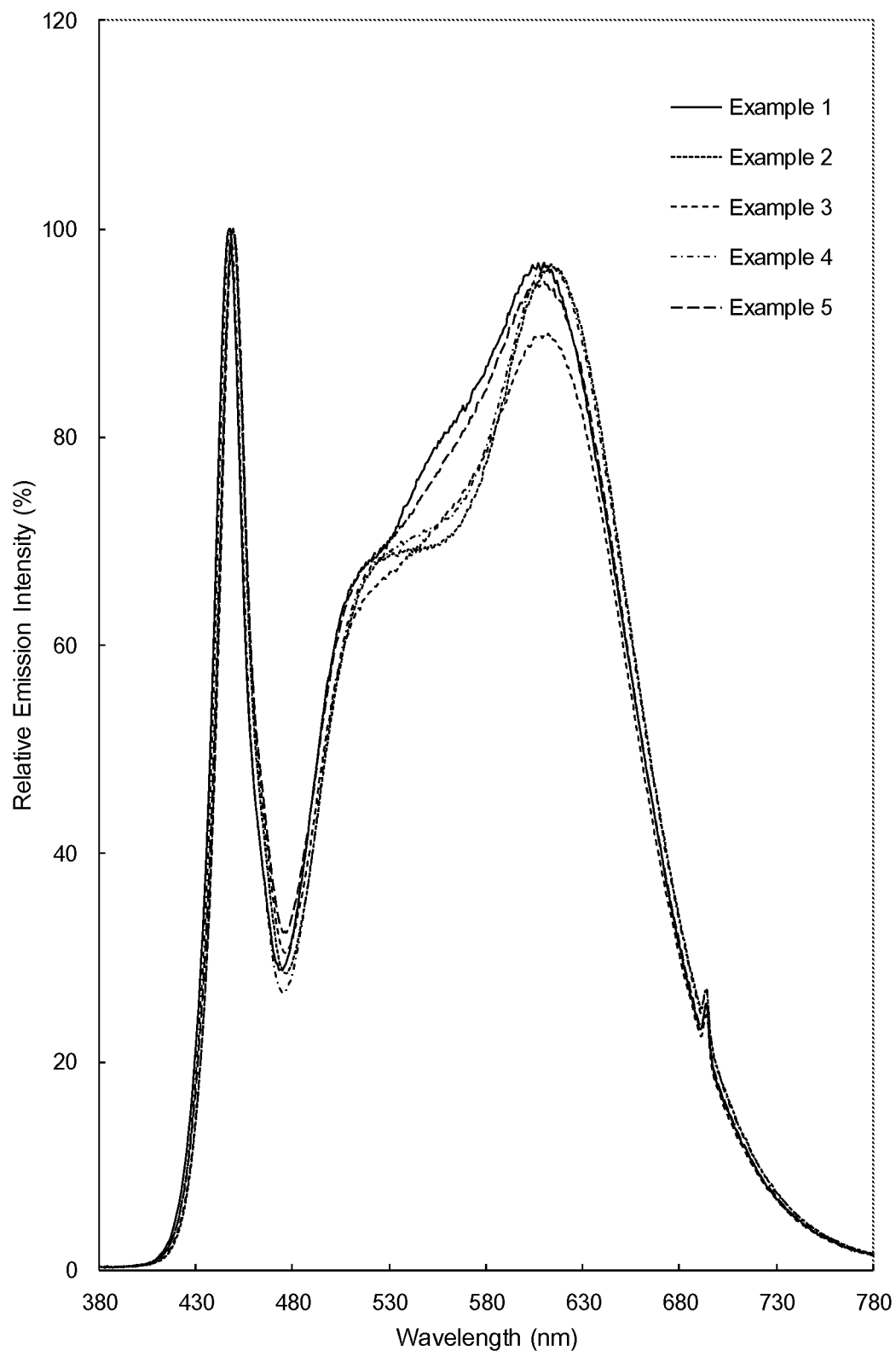
FIG. 3 shows examples of emission spectra of the relative emission intensity to the wavelength, of the light emitting devices according to Examples 1 to 5.

As shown in Table 1, a decrease in luminous efficiency were reduced to smallest possible values, and Ra and R9 were increased while maintaining high efficiency, and thus, high efficiencies and high color rendering properties were achieved at the same time in Example 1 to 5 compared to Comparative Example 3. As shown in Table 1, the emission characteristics of the light emitting devices change linearly in proportion to the content of chlorosilicate, the first phosphor, so that desired emission characteristics can be obtained easily. In Examples 1 to 5, the percentage contents of chlorosilicate (first phosphor) that can achieve high color rendering index (Ra≥90) at a correlated color temperature of 4,000 K are in a range of 1.5 to 10.0 mass % with respect to the total content of the phosphors, and in the case where the content of the second phosphor is set to 100, the ratios of contents of the first phosphor (hereinafter may be referred to as "relative contents of chlorosilicate") to the second phosphor are in a range of 1.6 to 10.8. In the case where the percentage content of chlorosilicate is in a range of 1.5 to 5.0 mass % with respect to the total content of the phosphors, and a relative content of chlorosilicate is in a range of 1.6 to 5.6, high efficiency (relative emission efficiency≥95) can also be satisfied at the same time. FIG. 3 illustrates a comparison of normalized emission spectra of light emitting devices according to Examples 1 to 5. The emission spectra shown in FIG. 3 show relative emission intensity versus wavelength.

Comparative Example 1

A light emitting device was produced in a similar manner as in Example 1, except that the first phosphor was not used and a combination of YAG and SCASN1 was used as phosphors.

Comparative Example 2

A light emitting device was produced in a similar manner as in Example 2, except that the first phosphor was not used and a combination of YAG and SCASN2 was used as phosphors.

Comparative Example 3

A light emitting device was produced in a similar manner as in Example 1, except that the first phosphor was not used and a combination of LAG and SCASN2 was used as phosphors.

Chromaticity coordinates of emission color, correlated color temperature (Tcp:K), average color rendering index (Ra), special color rendering index (R9), and luminous efficiency (1 m/W) of the light emitting devices obtained according to Comparative Examples 1 to 3 were measured. For the luminous efficiency, a relative luminous efficiency with respect to a luminous efficiency (lm/W) of Comparative Example 1 as a base of 100 is shown.

TABLE 2

|  | Comparative Example 1 | Comparative Example 2 | Comparative Example 3 |
|---|---|---|---|
| Chromaticity x | 0.386 | 0.382 | 0.384 |
| Coordinates y | 0.378 | 0.381 | 0.385 |
| Correlated Color Temperature (K) | 3847 | 3980 | 3953 |
| Average Color Rendering Index (Ra) | 81.6 | 82.0 | 89.5 |
| Special Color Rendering Index (R9) | 19.7 | 12.8 | 39.0 |
| Relative Luminous Efficiency | 100 | 108 | 102 |

Figure 4:
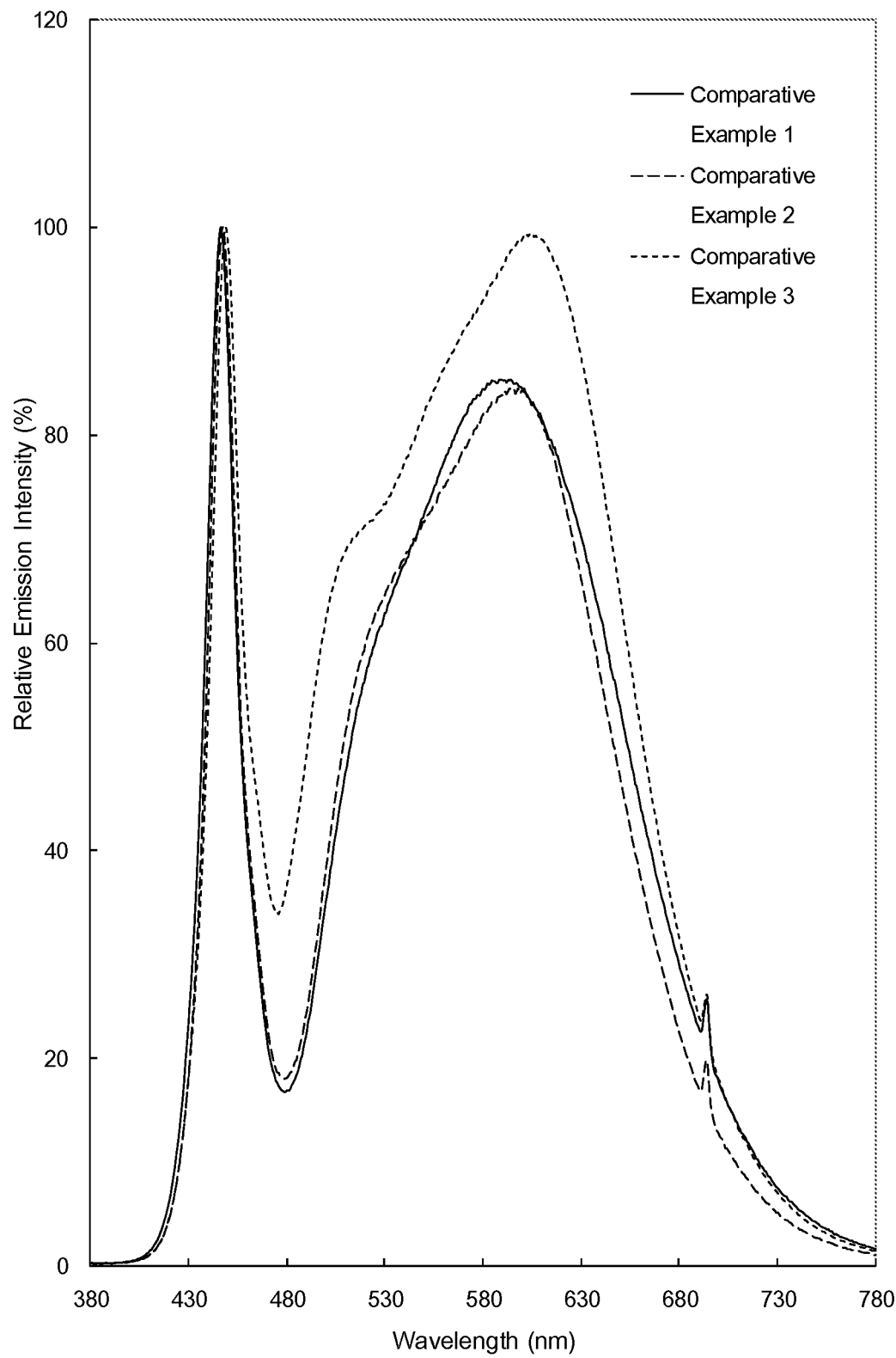
FIG. 4 shows examples of emission spectra of the relative emission intensity to the wavelength, of the light emitting devices according to Comparative Examples 1 to 3.

As shown in Table 2, Comparative Example 1 exhibited Ra of about 80 and R9 of about 20. In Comparative Example 2, SCASN2 is used, which allows maintaining of Ra equivalent or greater than that of comparative Example 1, while achieving a higher luminous efficiency than that of Comparative Example 1. SCASN2 has narrow half bandwidth and reduced longer-wavelength component that has low luminosity efficiency factor compared to that in SCASN1, so that luminous efficiency is improved but R9 that is an indicator of visibility of red color is reduced. Effects obtained by using the SCASN2 are confirmed in each of light emitting device having the various correlated color temperatures described below. Compared to Comparative Example 2, Comparative Example 3 employs LAG that has a peak emission wavelength at a shorter wavelength side than that of YAG, which allows obtaining of a wider spectrum and higher color rendering properties relative to that of Comparative Examples 1 and 2. The luminous efficiency and the color rendering properties are in trade-off relation, so that the luminous efficiency of Comparative Example 3 is lower than that of comparative Example 2. In the case of assuming the standard of high efficiency in Example 1 to 5 as, for example, 95 or greater as a relative luminous efficiency with respect to that of Comparative Example 1, Comparative Examples 2 and 3 exhibited high efficiency, but in the case of assuming the standard of high color rendering properties as Ra≥90, Comparative Examples 2 and 3 cannot be stated as of high color rendering properties. In other words, Comparative Examples 2 and 3 cannot be stated as of high color rendering properties and high efficiency at the same time. FIG. 4 illustrates a comparison of normalized emission spectra of light emitting devices according to Comparative Examples 1 to 3. The emission spectra shown in FIG. 4 show relative emission intensity versus wavelength.

Comparative Example 4

A light emitting device was produced in a similar manner as in Example 1, except that the first phosphor was not used and a combination of LAG and SCASN2 was used as phosphors, and the light emitting element having an emission wavelength of 445 nm was used.

Comparative Example 5

A light emitting device was produced in a similar manner as in Example 1, except that the first phosphor was not used and a combination of LAG and SCASN2 was used as phosphors, and the light emitting element having an emission wavelength of 455 nm was used.

Chromaticity coordinates of emission color, correlated color temperature (Tcp:K), average color rendering index (Ra), special color rendering index (R9), and luminous efficiency (1 m/W) of the light emitting devices obtained according to Comparative Examples 4 and 5 were measured. For the luminous efficiency, a relative luminous efficiency with respect to a luminous efficiency (1 m/W) of Comparative Example 1 as a base of 100 is shown.

TABLE 3

|  |  | Comparative Example 4 | Comparative Example 5 |
|---|---|---|---|
| Peak Emission Wavelength (nm) |  | 445 | 455 |

TABLE 3-continued

|  |  | Comparative Example 4 | Comparative Example 5 |
|---|---|---|---|
| Chromaticity Coordinates | x | 0.383 | 0.389 |
|  | y | 0.381 | 0.381 |
| Correlated Color Temperature (K) |  | 3932 | 3777 |
| Average Color Rendering Index (Ra) |  | 87.9 | 91.0 |
| Special Color Rendering Index (R9) |  | 37.2 | 53.6 |
| Relative Luminous Efficiency |  | 101 | 83 |

Figure 5:
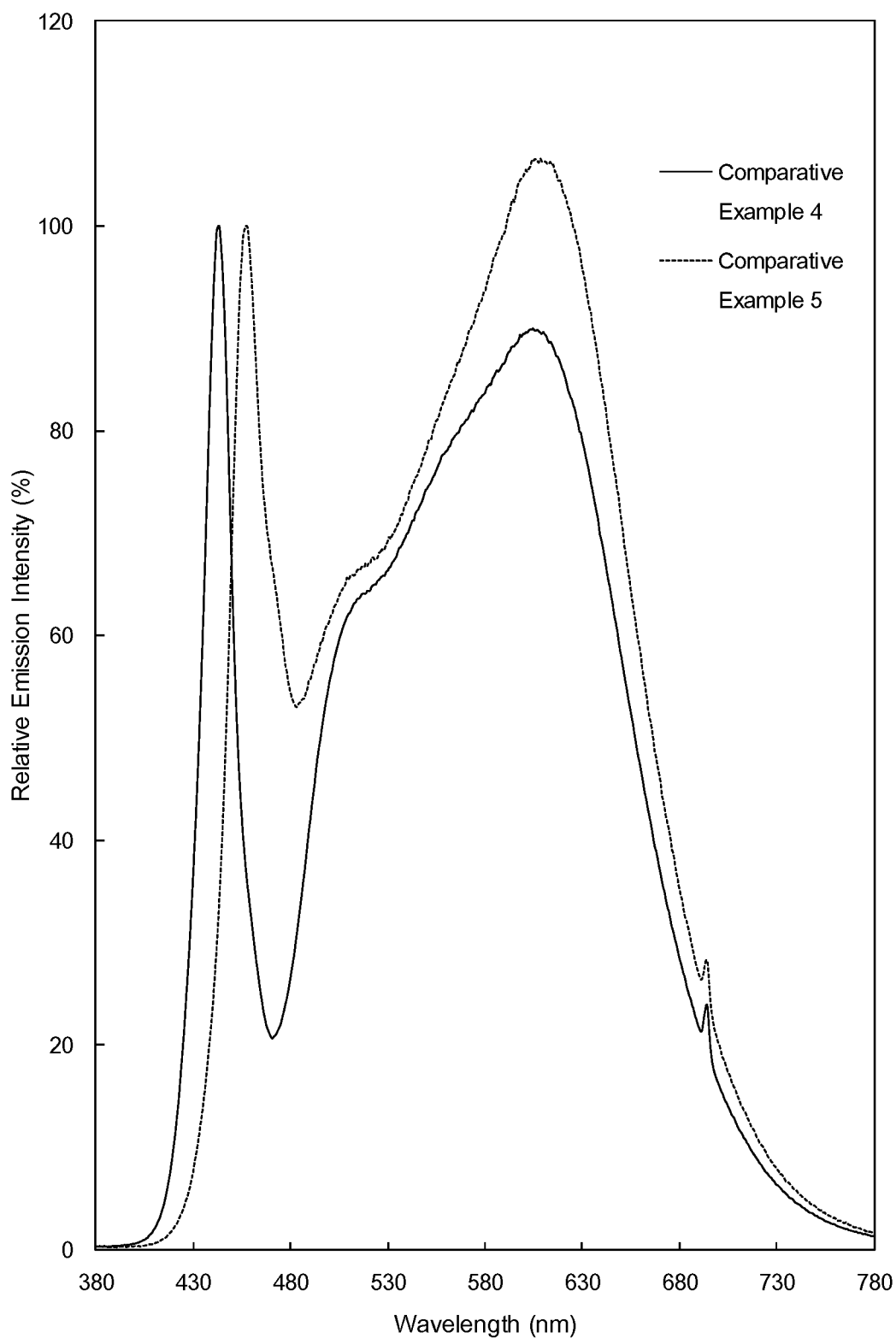
FIG. 5 shows examples of emission spectra of the relative emission intensity to the wavelength, of the light emitting devices according to Comparative Examples 4 and 5.

As shown in Table 3, the performance of the light emitting devices is largely affected by the peak emission wavelength of the light emitting element. Comparative Example 4 exhibited a higher luminous efficiency and lower color rendering properties in such as Ra and R9 than that of Comparative Example 5. That is, it is confirmed that the shorter the peak emission wavelength of the light emitting element, the greater in improvement in the luminous efficiency, and the longer the wavelength, the greater in improvement in the color rendering properties. The above and the luminous efficiency and the color rendering properties are in trade-off relation, so that it is assumed that a light emitting device of high color rendering properties and high luminous efficiency can be obtained with the light emitting element having a peak emission wavelength in a range of 445 nm to 455 nm. FIG. 5 illustrates a comparison of normalized emission spectra of light emitting devices according to Comparative Examples 4 and 5. The emission spectra shown in FIG. 5 show relative emission intensity versus wavelength.

Comparative Example 6

A light emitting device was produced in a similar manner as in Example 1, except that the first phosphor was not used and a combination of YAG and SCASN1 was used as phosphors and that the correlated color temperature was adjusted to 5,000K.

Comparative Example 7

A light emitting device was produced in a similar manner as in Example 1, except that the first phosphor was not used and a combination of LAG and SCASN2 was used as phosphors and that the correlated color temperature was adjusted to 5,000K.

Chromaticity coordinates of emission color, correlated color temperature (Tcp:K), average color rendering index (Ra), special color rendering index (R9), and luminous efficiency (1 m/W) of the light emitting devices obtained according to Comparative Examples 6 and 7 were measured. For the luminous efficiency, a relative luminous efficiency with respect to a luminous efficiency (1 m/W) of Comparative Example 1 as a base of 100 is shown.

TABLE 4

|  |  | Comparative Example 6 | Comparative Example 7 |
|---|---|---|---|
| Chromaticity Coordinates | x | 0.346 | 0.345 |
|  | y | 0.354 | 0.357 |
| Correlated Color Temperature (K) |  | 4926 | 4985 |

TABLE 4-continued

|  | Comparative Example 6 | Comparative Example 7 |
|---|---|---|
| Average Color Rendering Index (Ra) | 81.8 | 89.8 |
| Special Color Rendering Index (R9) | 19.0 | 41.9 |
| Relative Luminous Efficiency | 100 | 98 |

Figure 6:
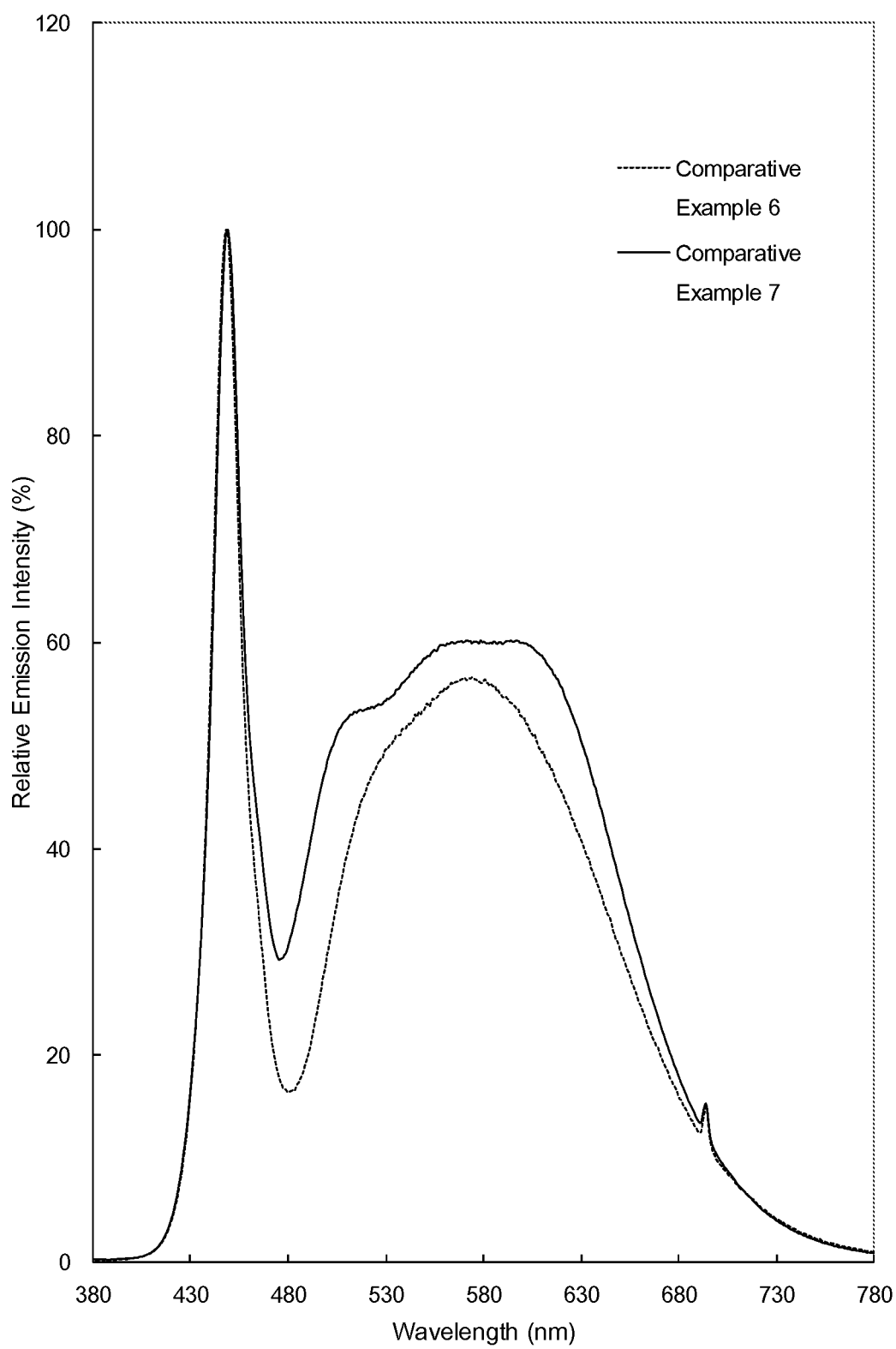
FIG. 6 shows examples of emission spectra of the relative emission intensity to the wavelength, of the light emitting devices according to Comparative Examples 6 and 7.

As shown in Table 4, Comparative Examples 6 and 7 showed similar tendency as those in Comparative Examples 1 and 3. FIG. 6 illustrates a comparison of normalized emission spectra of light emitting devices according to Comparative Examples 6 and 7. The emission spectra shown in FIG. 6 show relative emission intensity versus wavelength.

Examples 6 to 10

Light emitting devices were produced in a similar manner as in Example 1, except that contents of the phosphors were adjusted to satisfy the percentage contents shown in Table 5 to adjust the correlated color temperature to 5,000K.

Chromaticity coordinates of emission color, correlated color temperature (Tcp:K), average color rendering index (Ra), special color rendering index (R9), and luminous efficiency (1 m/W) of the light emitting devices obtained according to Examples 6 and 10 were measured. The results are shown in Table 5 below. For the luminous efficiency, a relative luminous efficiency with respect to a luminous efficiency (1 m/W) of Comparative Example 1 as a base of 100 is shown. "Phosphor content ratio" shown in Table 5 is a content of the first phosphor to the content of the second phosphor or the third phosphor as a base of 100.

TABLE 5

|  | Example 6 | Example 7 | Example 8 | Example 9 | Example 10 |
|---|---|---|---|---|---|
| First Phosphor Percentage Content (mass %) | 1.5 | 3.0 | 5.0 | 7.5 | 10.0 |
| Third Phosphor Percentage Content (mass %) | 3.9 | 4.6 | 5.3 | 5.4 | 6.4 |
| Phosphor Content Ratio First Phosphor versus Second Phosphor | 1.6 | 3.2 | 5.6 | 8.6 | 12.0 |
| Phosphor Content Ratio First Phosphor versus Third Phosphor | 38.5 | 65.0 | 94.1 | 139.0 | 157.0 |
| Chromaticity Coordinates x | 0.350 | 0.342 | 0.346 | 0.351 | 0.345 |
| Chromaticity Coordinates y | 0.352 | 0.356 | 0.355 | 0.354 | 0.354 |
| Correlated Color Temperature (K) | 4782 | 5104 | 4889 | 4765 | 4925 |
| Average Color Rendering Index (Ra) | 91.0 | 91.7 | 93.1 | 93.7 | 94.6 |
| Special Color Rendering Index (R9) | 45.5 | 51.8 | 59.2 | 68.9 | 69.5 |
| Relative Luminous Efficiency | 96 | 95 | 94 | 92 | 91 |

Figure 7:
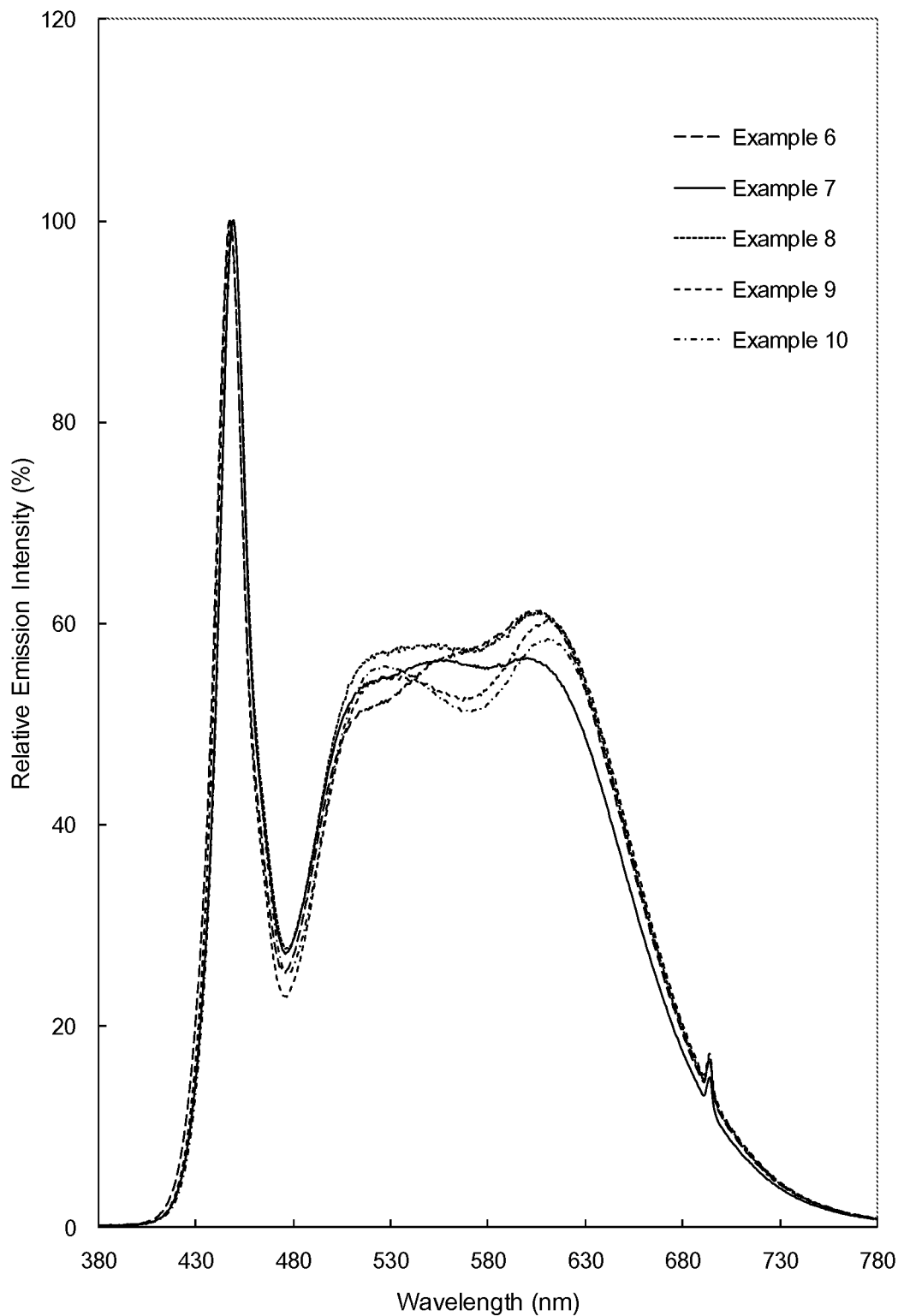
FIG. 7 shows examples of emission spectra of the relative emission intensity to the wavelength, of the light emitting devices according to Examples 6 to 10.

As shown in Table 5, in Examples 6 to 10, a decrease in luminous efficiency were reduced to smallest possible values with respect to that of Comparative Example 7, and Ra and R9 were increased while maintaining high efficiency. Thus, high efficiencies and high color rendering properties were achieved at the same time. In Examples 6 to 10, the percentage contents of chlorosilicate (first phosphor) that can obtain high color rendering index (Ra>90) at a correlated color temperature of 5,000 K are in a range of 1.5 to 10.0 mass % with respect to the total content of the phosphors, and in the case where the content of the second phosphor is set to 100, the content ratios of the first phosphor (relative contents of chlorosilicate) to the second phosphor is are a range of 1.6 to 12.0. In the case where the percentage content of chlorosilicate is in a range of 1.5 to 3.0 mass % with respect to the total content of the phosphors, and a relative content of chlorosilicate is in a range of 1.6 to 3.2, high efficiency (relative emission efficiency≥95) can also be satisfied at the same time. FIG. 7 illustrates a comparison of normalized emission spectra of light emitting devices according to Comparative Examples 6 to 10. The emission spectra shown in FIG. 7 show relative emission intensity versus wavelength.

Comparative Example 8

A light emitting device was produced in a similar manner as in Example 1, except that the first phosphor was not used and a combination of YAG and SCASN1 was used as phosphors and that the correlated color temperature was adjusted to 4,500K.

Comparative Example 9

A light emitting device was produced in a similar manner as in Example 1, except that the first phosphor was not used and a combination of LAG and SCASN2 was used as phosphors and that the correlated color temperature was adjusted to 4,500K.

Chromaticity coordinates of emission color, correlated color temperature (Tcp:K), average color rendering index (Ra), special color rendering index (R9), and luminous efficiency (1 m/W) of the light emitting devices obtained according to Comparative Examples 8 and 9 were measured. For the luminous efficiency, a relative luminous efficiency with respect to a luminous efficiency (1 m/W) of Comparative Example 1 as a base of 100 is shown.

TABLE 6

|  | | Comparative Example 8 | Comparative Example 9 |
|---|---|---|---|
| Chromaticity | x | 0.363 | 0.362 |
| Coordinates | y | 0.368 | 0.369 |
| Correlated Color Temperature (K) | | 4441 | 4466 |
| Average Color Rendering Index (Ra) | | 81.8 | 89.8 |
| Special Color Rendering Index (R9) | | 25.1 | 41.9 |
| Relative Luminous Efficiency | | 100 | 97 |

Figure 8:
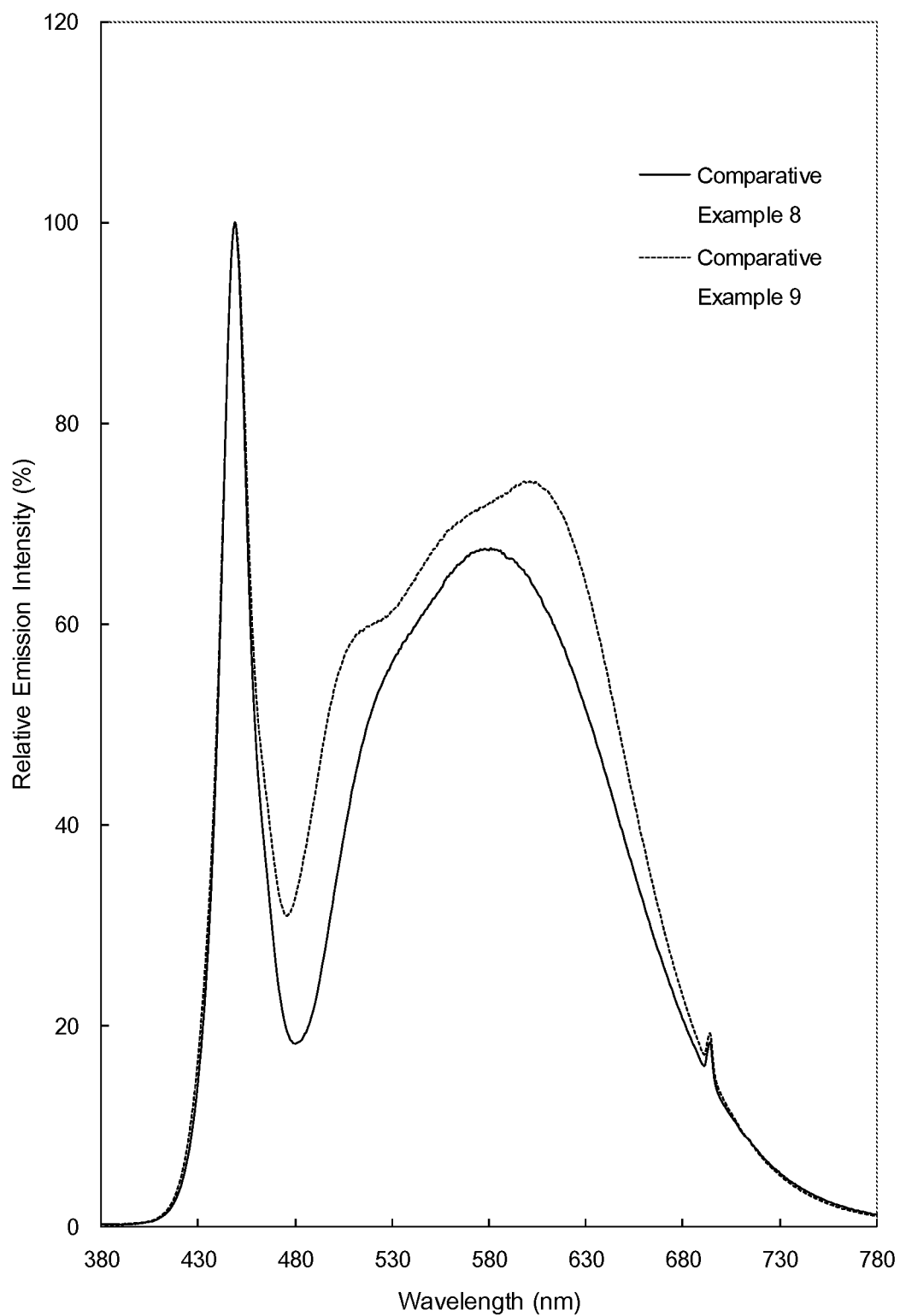
FIG. 8 shows examples of emission spectra of the relative emission intensity to the wavelength, of the light emitting devices according to Comparative Examples 8 and 9.

As shown in Table 6, Comparative Examples 8 and 9 showed similar tendency as those in Comparative Examples 1 and 3. FIG. 8 illustrates a comparison of normalized emission spectra of light emitting devices according to Comparative Examples 8 and 9. The emission spectra shown in FIG. 8 show relative emission intensity versus wavelength.

Examples 11 to 15

Light emitting devices were produced in a similar manner as in Example 1, except that contents of the phosphors were adjusted to satisfy the ratios of contents shown in Table 7 to adjust the correlated color temperature to 4,500K.

Chromaticity coordinates of emission color, correlated color temperature (Tcp:K), average color rendering index (Ra), special color rendering index (R9), and luminous efficiency (1 m/W) of the light emitting devices obtained according to Examples 11 to 15 were measured. The results are shown in Table 7 below. For the luminous efficiency, a relative luminous efficiency with respect to a luminous efficiency (1 m/W) of Comparative Example 1 as a base of 100 is shown. "Phosphor content ratio" shown in Table 7 is a content of the first phosphor with respect to the content of the second phosphor or the third phosphor as a base of 100.

Figure 9:
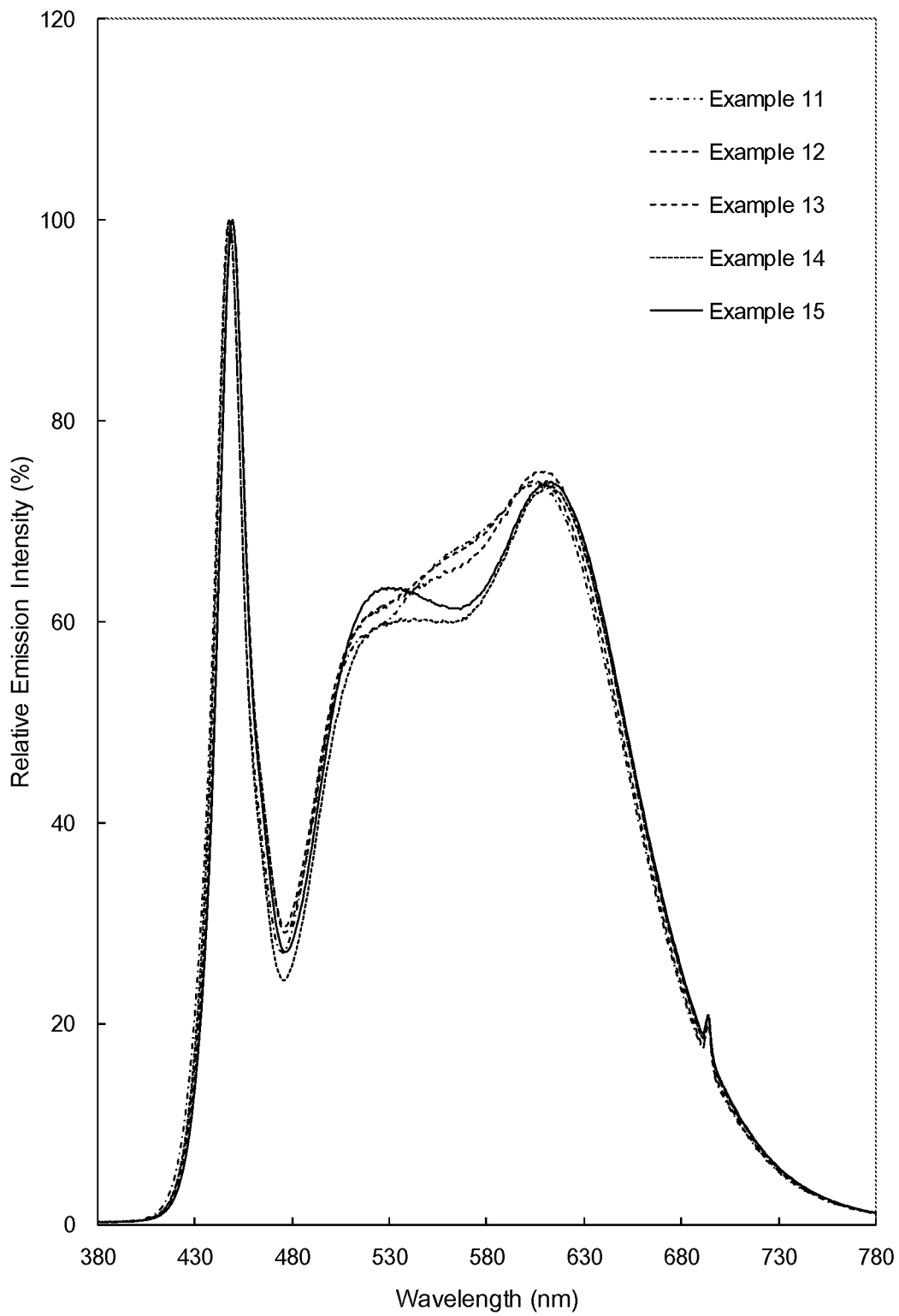
FIG. 9 shows examples of emission spectra of the relative emission intensity to the wavelength, of the light emitting devices according to Examples 11 to 15.

As shown in Table 7, in Examples 11 to 15, a decrease in luminous efficiency were reduced to smallest possible values with respect to that of Comparative Example 9, and Ra and R9 were increased while maintaining high efficiency. Thus, high efficiencies and high color rendering properties were achieved at the same time. In Examples 11 to 15, the percentage contents of chlorosilicate (first phosphor) that can obtain high color rendering index (Ra≥90) at a correlated color temperature of 4,500 K is in a range of 1.5 to 10.0 mass % with respect to the total content of the phosphors, and in the case where the content of the second phosphor is set to 100, the content ratios of the first phosphor (relative contents of chlorosilicate) to the second phosphor is in a range of 1.6 to 12.0. In the case where the percentage content of chlorosilicate is in a range of 1.5 to 3.0 mass % with respect to the total content of the phosphors, and a relative content of chlorosilicate is in a range of 1.6 to 3.2, high efficiency (relative emission efficiency≥95) can also be satisfied at the same time. FIG. 9 illustrates a comparison of normalized emission spectra of light emitting devices according to Comparative Examples 11 to 15. The emission spectra shown in FIG. 9 show relative emission intensity versus wavelength.

Comparative Example 10

A light emitting device was produced in a similar manner as in Example 1, except that the first phosphor was not used and a combination of YAG and SCASN1 was used as phosphors and that the correlated color temperature was adjusted to 3,500K.

Comparative Example 11

A light emitting device was produced in a similar manner as in Example 1, except that the first phosphor was not used and a combination of LAG and SCASN2 was used as phosphors and that the correlated color temperature was adjusted to 3,500K.

Chromaticity coordinates of emission color, correlated color temperature (Tcp:K), average color rendering index

TABLE 7

|  | | Example 11 | Example 12 | Example 13 | Example 14 | Example 15 |
|---|---|---|---|---|---|---|
| First Phosphor Percentage Content (mass %) | | 1.5 | 3.0 | 5.0 | 7.5 | 10.0 |
| Third Phosphor Percentage Content (mass %) | | 4.2 | 4.6 | 5.3 | 5.9 | 6.4 |
| Phosphor Content Ratio First Phosphor versus Second Phosphor | | 1.6 | 3.2 | 5.6 | 8.7 | 12.0 |
| Phosphor Content Ratio First Phosphor versus Third Phosphor | | 36.0 | 65.0 | 94.0 | 128.0 | 157.0 |
| Chromaticity | x | 0.363 | 0.363 | 0.364 | 0.366 | 0.364 |
| Coordinates | y | 0.366 | 0.368 | 0.366 | 0.363 | 0.368 |
| Correlated Color Temperature (K) | | 4401 | 4419 | 4349 | 4287 | 4374 |
| Average Color Rendering Index (Ra) | | 90.7 | 91.7 | 93.1 | 94.2 | 94.6 |
| Special Color Rendering Index (R9) | | 48.2 | 51.8 | 59.2 | 66.0 | 68.5 |
| Relative Luminous Efficiency | | 95 | 94 | 93 | 92 | 91 |

(Ra), special color rendering index (R9), and luminous efficiency (1 m/W) of the light emitting devices obtained according to Comparative Examples 10 and 11 were measured. For the luminous efficiency, a relative luminous efficiency with respect to a luminous efficiency (1 m/W) of Comparative Example 1 as a base of 100 is shown. "Phosphor content ratio" shown in Table 9 is a content of the first phosphor to the content of the second phosphor or the third phosphor as a base of 100.

TABLE 9

|  | Example 16 | Example 17 | Example 18 | Example 19 | Example 20 |
|---|---|---|---|---|---|
| First Phosphor Percentage Content (mass %) | 1.5 | 3.0 | 5.0 | 7.5 | 10.0 |
| Third Phosphor Percentage Content (mass %) | 5.4 | 5.9 | 6.5 | 7.1 | 7.7 |
| Phosphor Content Ratio First Phosphor versus Second Phosphor | 1.6 | 3.3 | 5.7 | 8.8 | 12.2 |
| Phosphor Content Ratio First Phosphor versus Third Phosphor | 29.0 | 51.0 | 77.0 | 106.0 | 130.0 |
| Chromaticity x | 0.413 | 0.412 | 0.413 | 0.416 | 0.412 |
| Coordinates y | 0.392 | 0.393 | 0.393 | 0.392 | 0.394 |
| Correlated Color Temperature (K) | 3317 | 3348 | 3326 | 3267 | 3366 |
| Average Color Rendering Index (Ra) | 90.7 | 91.6 | 92.5 | 93.6 | 94.4 |
| Special Color Rendering Index (R9) | 42.9 | 46.5 | 49.9 | 55.1 | 58.1 |
| Relative Luminous Efficiency | 99 | 97 | 97 | 95 | 94 | respect to a luminous efficiency (1 m/W) of Comparative Example 1 as a base of 100 is shown.

TABLE 8

|  | Comparative Example 10 | Comparative Example 11 |
|---|---|---|
| Chromaticity x | 0.413 | 0.411 |
| Coordinates y | 0.392 | 0.395 |
| Correlated Color Temperature (K) | 3320 | 3399 |
| Average Color Rendering Index (Ra) | 82.2 | 89.9 |
| Special Color Rendering Index (R9) | 20.4 | 39.6 |
| Relative Luminous Efficiency | 100 | 101 |

Figure 10:
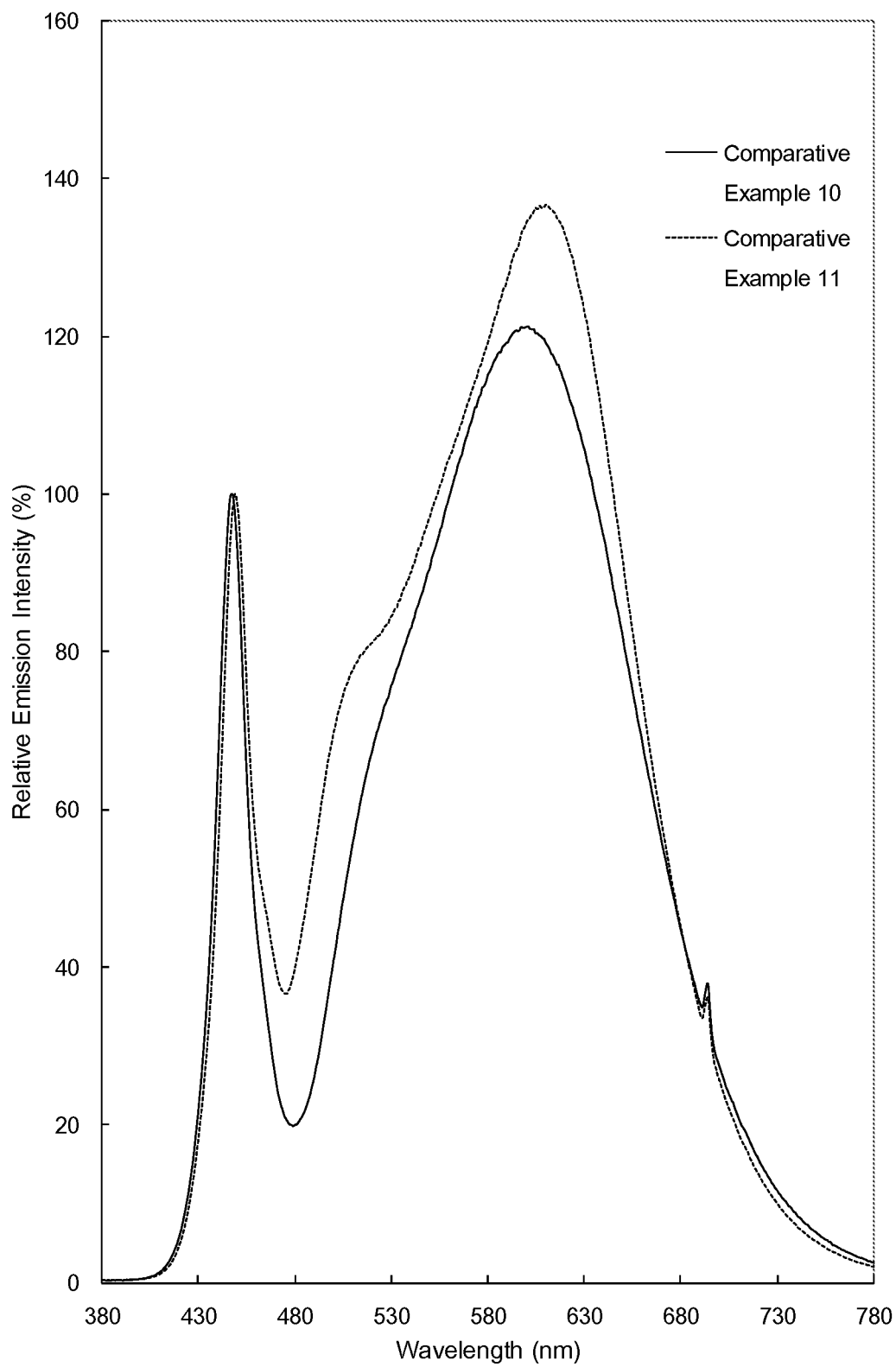
FIG. 10 shows examples of emission spectra of the relative emission intensity to the wavelength, of the light emitting devices according to Comparative Examples 10 and 11.

As shown in Table 8, Comparative Examples 10 and 11 showed similar tendency as those in Comparative Examples 1 and 3. FIG. 10 illustrates a comparison of normalized emission spectra of light emitting devices according to Comparative Examples 10 and 11. The emission spectra shown in FIG. 10 show relative emission intensity versus wavelength.

Examples 16 to 20

Light emitting devices were produced in a similar manner as in Example 1, except that contents of the phosphors were adjusted to satisfy the percentage contents shown in Table 9 to adjust the correlated color temperature to 3,500K.

Figure 11:
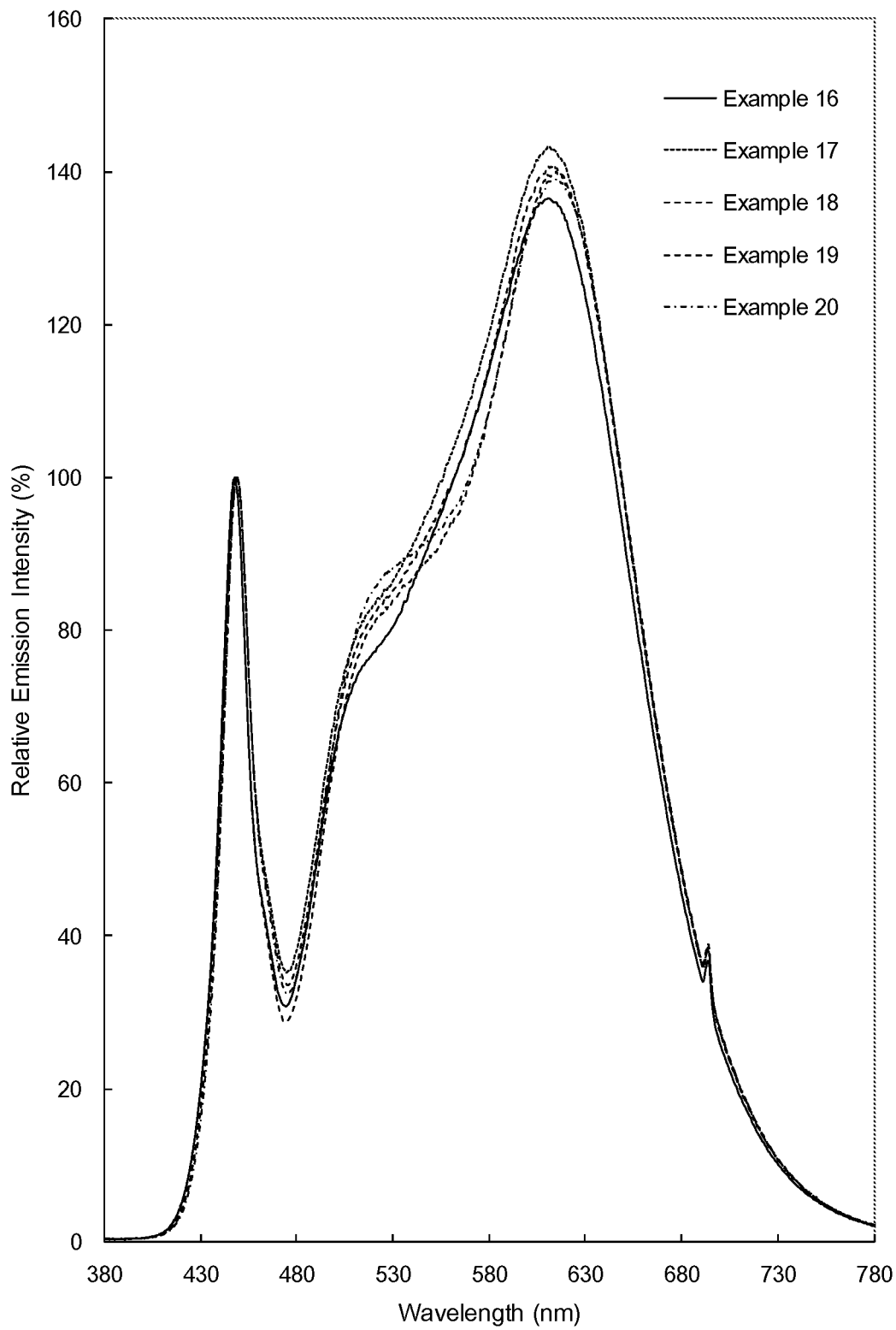
FIG. 11 shows examples of emission spectra of the relative emission intensity to the wavelength, of the light emitting devices according to Examples 16 to 20.

Chromaticity coordinates of emission color, correlated color temperature (Tcp:K), average color rendering index (Ra), special color rendering index (R9), and luminous efficiency (1 m/W) of the light emitting devices obtained according to Examples 16 to 20 were measured. The results are shown in Table 9 below. For the luminous efficiency, a As shown in Table 9, in Examples 16 to 20, a decrease in luminous efficiency were reduced to smallest possible values with respect to that of Comparative Example 11, and Ra and R9 were increased while maintaining high efficiency. Thus, high efficiencies and high color rendering properties were achieved at the same time. In Examples 16 to 20, the percentage contents of chlorosilicate (first phosphor) that can obtain high color rendering index (Ra≥90) at a correlated color temperature of 3,500 K are in a range of 1.5 to 10.0 mass % with respect to the total content of the phosphors, and in the case where the content of the second phosphor is set to 100, the content ratios of the first phosphor (relative contents of chlorosilicate) to the second phosphor are in a range of 1.6 to 12.2. In the case where the percentage content of chlorosilicate is in a range of 1.5 to 7.5 mass % with respect to the total content of the phosphors, and a relative content of chlorosilicate is in a range of 1.6 to 8.8, high efficiency (relative emission efficiency≥95) can also be satisfied at the same time. FIG. 11 illustrates a comparison of normalized emission spectra of light emitting devices according to Comparative Examples 16 to 20. The emission spectra shown in FIG. 11 show relative emission intensity versus wavelength.

Comparative Example 12

A light emitting device was produced in a similar manner as in Example 1, except that the first phosphor was not used and a combination of YAG and SCASN1 was used as phosphors and that the correlated color temperature was adjusted to 3,000K.

Comparative Example 13

A light emitting device was produced in a similar manner as in Example 1, except that the first phosphor was not used and a combination of LAG and SCASN2 was used as phosphors and that the correlated color temperature was adjusted to 3,000K.

Chromaticity coordinates of emission color, correlated color temperature (Tcp:K), average color rendering index (Ra), special color rendering index (R9), and luminous efficiency (1 m/W) of the light emitting devices obtained according to Comparative Examples 12 and 13 were measured. For the luminous efficiency, a relative luminous efficiency with respect to a luminous efficiency (1 m/W) of Comparative Example 1 as a base of 100 is shown.

efficiency (1 m/W) of the light emitting devices obtained according to Examples 21 to 25 were measured. The results are shown in Table 11 below. For the luminous efficiency, a relative luminous efficiency with respect to a luminous efficiency (1 m/W) of Comparative Example 1 as a base of 100 is shown. "Phosphor content ratio" shown in Table 11 is a content of the first phosphor with respect to the content of the second phosphor or the third phosphor as a base of 100.

TABLE 11

|  | Example 21 | Example 22 | Example 23 | Example 24 | Example 25 |
|---|---|---|---|---|---|
| First Phosphor Percentage Content (mass %) | 3.0 | 5.0 | 7.5 | 10.0 | 15.0 |
| Third Phosphor Percentage Content (mass %) | 6.4 | 7.0 | 7.7 | 8.3 | 9.6 |
| Phosphor Content Ratio First Phosphor versus Second Phosphor | 3.3 | 5.7 | 8.8 | 12.2 | 19.9 |
| Phosphor Content Ratio First Phosphor versus Third Phosphor | 47.0 | 72.0 | 97.0 | 120.0 | 157.0 |
| Chromaticity Coordinates x | 0.431 | 0.436 | 0.436 | 0.433 | 0.437 |
| Chromaticity Coordinates y | 0.402 | 0.405 | 0.411 | 0.402 | 0.402 |
| Correlated Color Temperature (K) | 3072 | 3003 | 3048 | 3042 | 2962 |
| Average Color Rendering Index (Ra) | 90.9 | 91.4 | 91.6 | 93.5 | 94.5 |
| Special Color Rendering Index (R9) | 41.4 | 42.9 | 43.2 | 51.6 | 56.6 |
| Relative Luminous Efficiency | 98 | 97 | 97 | 94 | 91 |

TABLE 10

|  | Comparative Example 12 | Comparative Example 13 |
|---|---|---|
| Chromaticity Coordinates x | 0.435 | 0.435 |
| Chromaticity Coordinates y | 0.403 | 0.404 |
| Correlated Color Temperature (K) | 3009 | 3023 |
| Average Color Rendering Index (Ra) | 82.0 | 89.4 |
| Special Color Rendering Index (R9) | 18.2 | 35.9 |
| Relative Luminous Efficiency | 100 | 100 |

Figure 12:
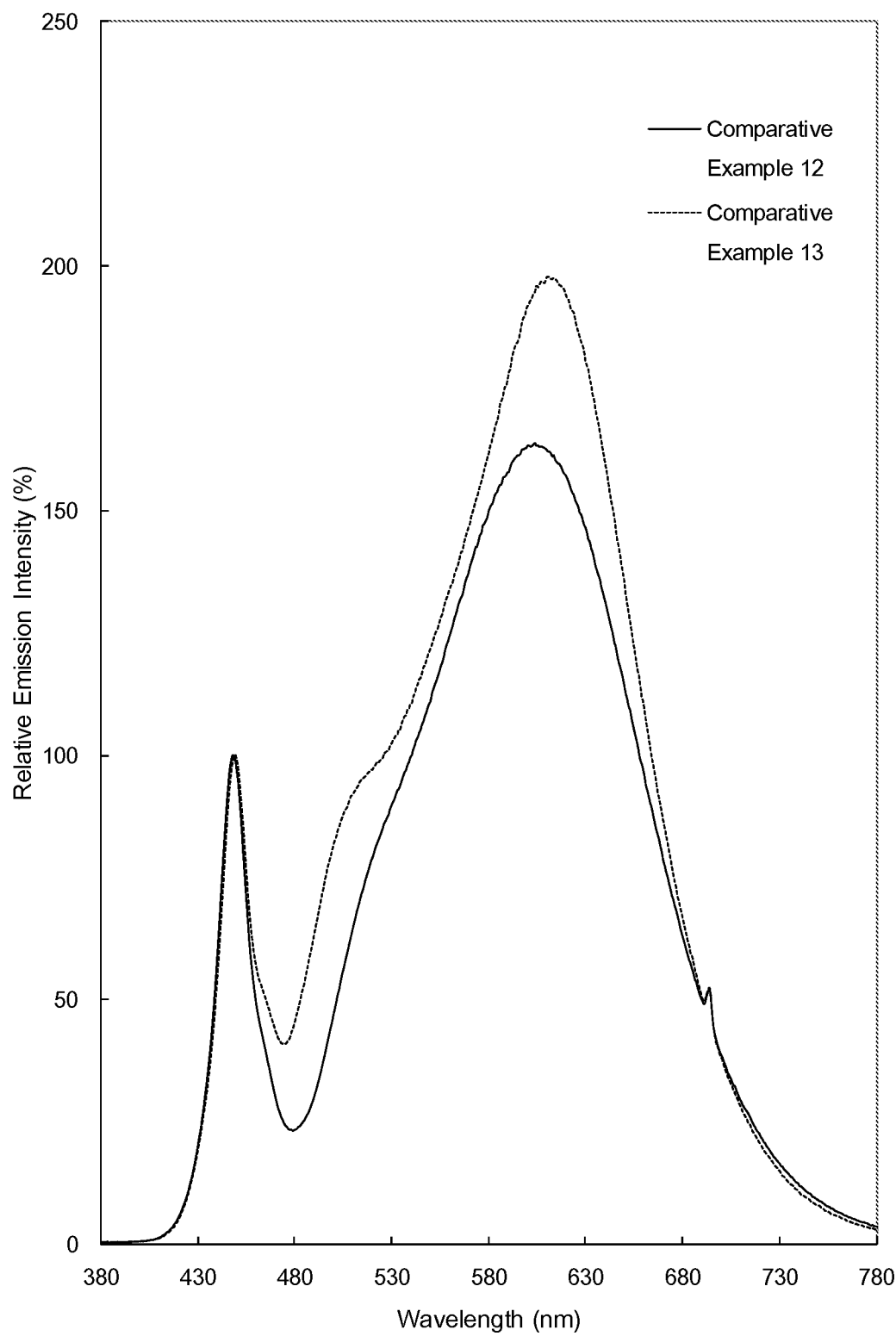
FIG. 12 shows examples of emission spectra of the relative emission intensity to the wavelength, of the light emitting devices according to Comparative Examples 12 and 13.

As shown in Table 10, Comparative Examples 12 and 13 showed similar tendency as those in Comparative Examples 1 and 3. FIG. 12 illustrates a comparison of normalized emission spectra of light emitting devices according to Comparative Examples 12 and 13. The emission spectra shown in FIG. 12 show relative emission intensity versus wavelength.

Examples 21 to 25

Light emitting devices were produced in a similar manner as in Example 1, except that contents of the phosphors were adjusted to satisfy the percentage contents shown in Table 11 to adjust the correlated color temperature to 3,000K.

Figure 13:
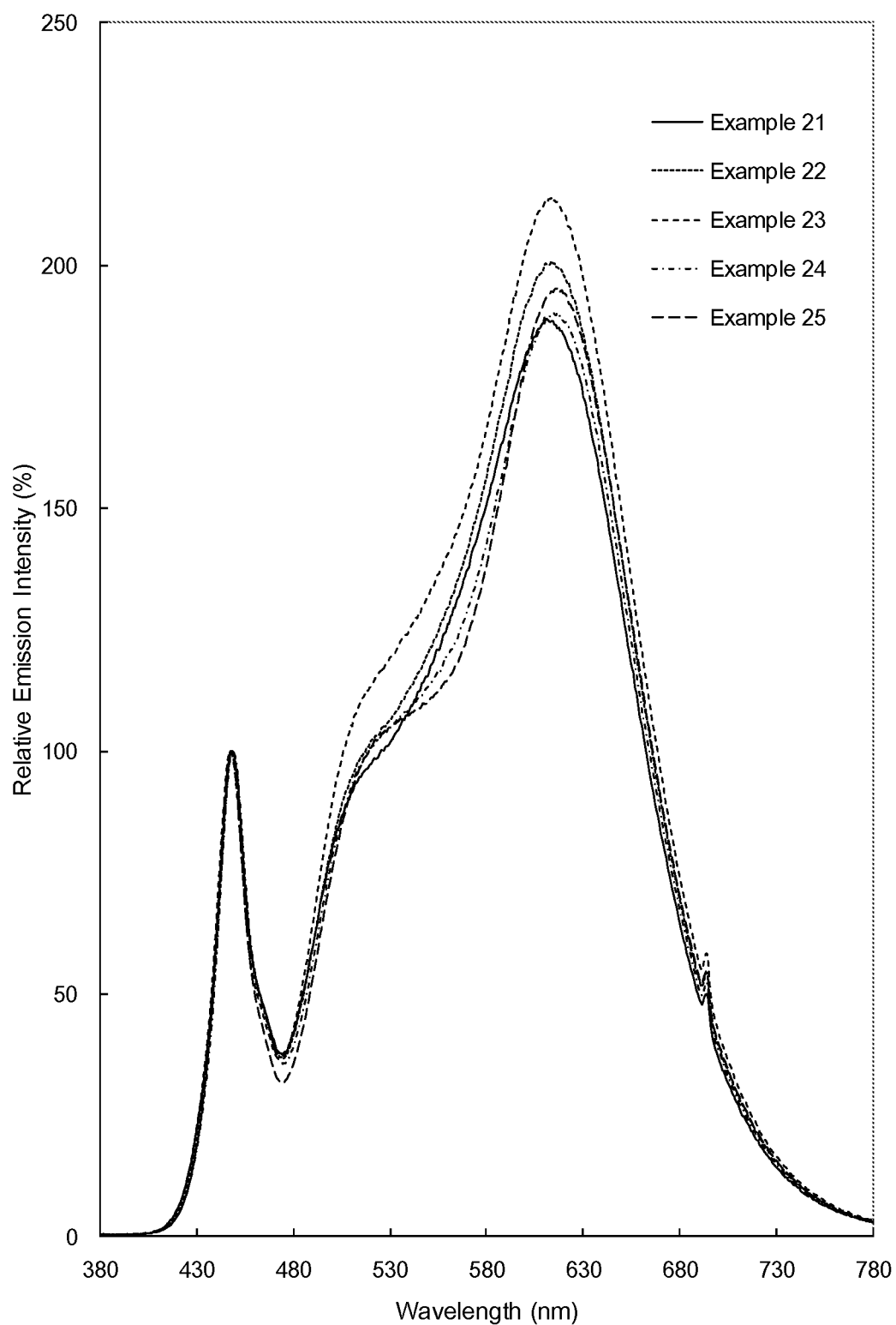
FIG. 13 shows examples of emission spectra of the relative emission intensity to the wavelength, of the light emitting devices according to Examples 21 to 25.

Chromaticity coordinates of emission color, correlated color temperature (Tcp:K), average color rendering index (Ra), special color rendering index (R9), and luminous As shown in Table 11, in Examples 21 to 25, a decrease in luminous efficiency were reduced to smallest possible values with respect to that of Comparative Example 13, and Ra and R9 were increased while maintaining high efficiency. Thus, high efficiencies and high color rendering properties were achieved at the same time. In Examples 21 to 25, the percentage contents of chlorosilicate (first phosphor) that can obtain high color rendering index (Ra≥90) at a correlated color temperature of 3,000 K are in a range of 3.0 to 15.0 mass % with respect to the total content of the phosphors, and in the case where the content of the second phosphor is set to 100, the content ratios of the first phosphor (relative contents of chlorosilicate) to the second phosphor are in a range of 3.3 to 19.9. In the case where the percentage content of chlorosilicate is in a range of 3.0 to 7.5 mass % with respect to the total content of the phosphors, and a relative content of chlorosilicate is in a range of 3.3 to 8.8, high efficiency (relative emission efficiency>95) can also be satisfied at the same time. FIG. 13 illustrates a comparison of normalized emission spectra of light emitting devices according to Comparative Examples 21 to 25. The emission spectra shown in FIG. 13 show relative emission intensity versus wavelength.

Comparative Example 14

A light emitting device was produced in a similar manner as in Example 1, except that the first phosphor was not used and a combination of YAG and SCASN1 was used as phosphors and that the correlated color temperature was adjusted to 2,700K.

Comparative Example 15

A light emitting device was produced in a similar manner as in Example 1, except that the first phosphor was not used and a combination of LAG and SCASN2 was used as phosphors and that the correlated color temperature was adjusted to 2,700K.

Chromaticity coordinates of emission color, correlated color temperature (Tcp:K), average color rendering index (Ra), special color rendering index (R9), and luminous efficiency (2 m/W) of the light emitting devices obtained according to Comparative Examples 14 and 15 were measured. For the luminous efficiency, a relative luminous efficiency with respect to a luminous efficiency (1 m/W) of Comparative Example 1 as a base of 100 is shown.

efficiency (1 m/W) of the light emitting devices obtained according to Examples 26 to 30 were measured. The results are shown in Table 13 below. For the luminous efficiency, a relative luminous efficiency with respect to a luminous efficiency (1 m/W) of Comparative Example 1 as a base of 100 is shown. "Phosphor content ratio" shown in Table 13 is a content of the first phosphor with respect to the content of the second phosphor or the third phosphor as a base of 100.

TABLE 13

|  | Example 26 | Example 27 | Example 28 | Example 29 | Example 30 |
| --- | --- | --- | --- | --- | --- |
| First Phosphor Percentage Content (mass %) | 3.0 | 5.0 | 7.5 | 10.0 | 15.0 |
| Third Phosphor Percentage Content (mass %) | 6.8 | 7.1 | 7.7 | 8.3 | 9.5 |
| Phosphor Content Ratio First Phosphor versus Second Phosphor | 3.3 | 5.7 | 8.8 | 12.2 | 19.9 |
| Phosphor Content Ratio First Phosphor versus Third Phosphor | 44.0 | 71.0 | 97.0 | 120.0 | 158.0 |
| Chromaticity Coordinates x | 0.453 | 0.459 | 0.462 | 0.460 | 0.471 |
| Chromaticity Coordinates y | 0.411 | 0.411 | 0.418 | 0.412 | 0.421 |
| Correlated Color Temperature (K) | 2768 | 2708 | 2707 | 2691 | 2611 |
| Average Color Rendering Index (Ra) | 90.2 | 90.7 | 90.9 | 92.4 | 93.4 |
| Special Color Rendering Index (R9) | 37.3 | 38.9 | 39.2 | 44.7 | 48.0 |
| Relative Luminous Efficiency | 98 | 97 | 97 | 94 | 94 |

TABLE 12

|  | Comparative Example 14 | Comparative Example 15 |
| --- | --- | --- |
| Chromaticity Coordinates x | 0.459 | 0.460 |
| Chromaticity Coordinates y | 0.411 | 0.410 |
| Correlated Color Temperature (K) | 2704 | 2679 |
| Average Color Rendering Index (Ra) | 81.4 | 88.2 |
| Special Color Rendering Index (R9) | 15.1 | 30.2 |
| Relative Luminous Efficiency | 100 | 98 |

Figure 14:
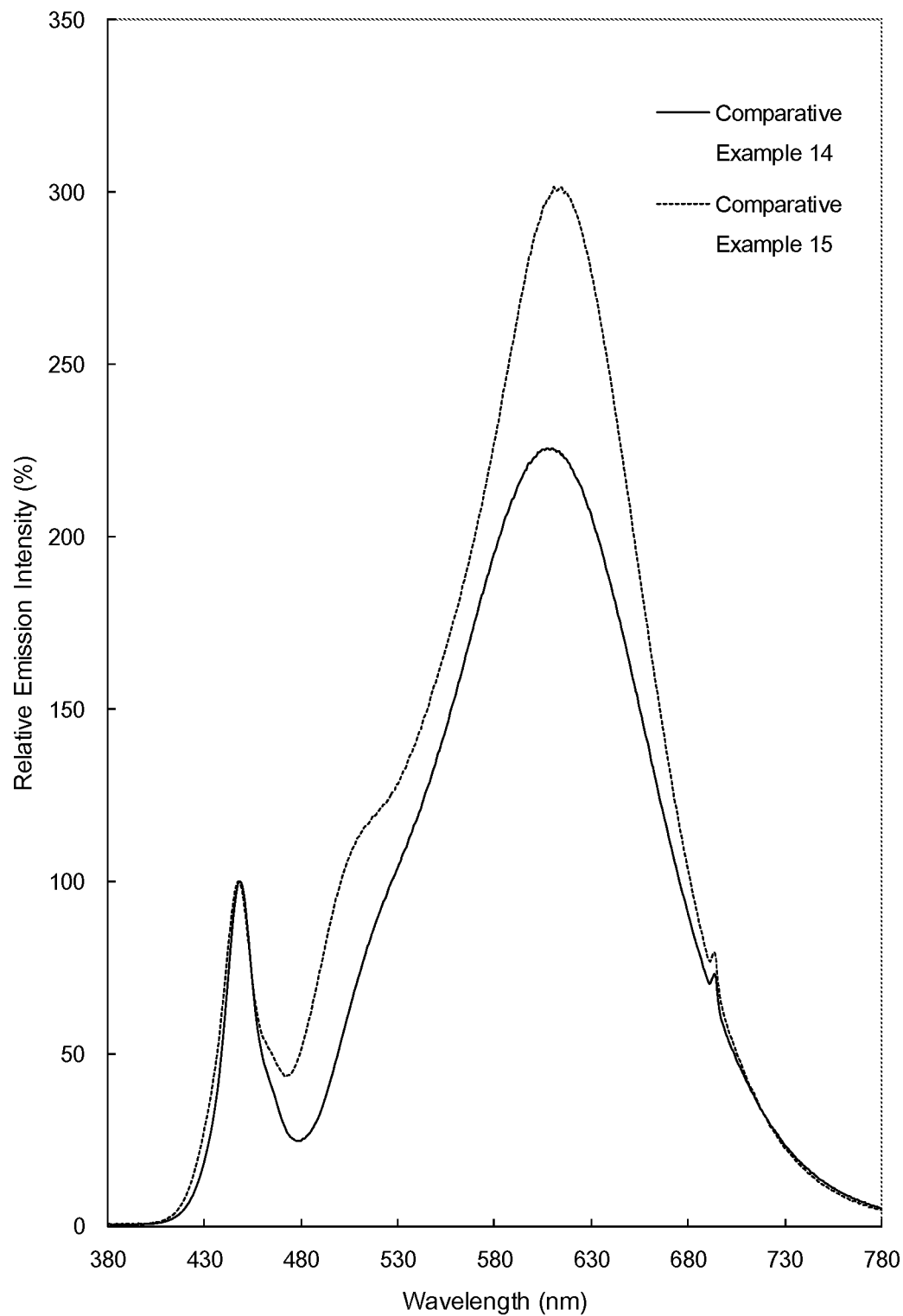
FIG. 14 shows examples of emission spectra of the relative emission intensity to the wavelength, of the light emitting devices according to Comparative Examples 14 and 15.

As shown in Table 12, Comparative Examples 14 and 15 showed similar tendency as those in Comparative Examples 1 and 3. FIG. 14 illustrates a comparison of normalized emission spectra of light emitting devices according to Comparative Examples 14 and 15. The emission spectra shown in FIG. 14 show relative emission intensity versus wavelength.

Examples 26 to 30

Light emitting devices were produced in a similar manner as in Example 1, except that contents of the phosphors were adjusted to satisfy the ratios of contents shown in Table 13 to adjust the correlated color temperature to 2,700K.

Figure 15:
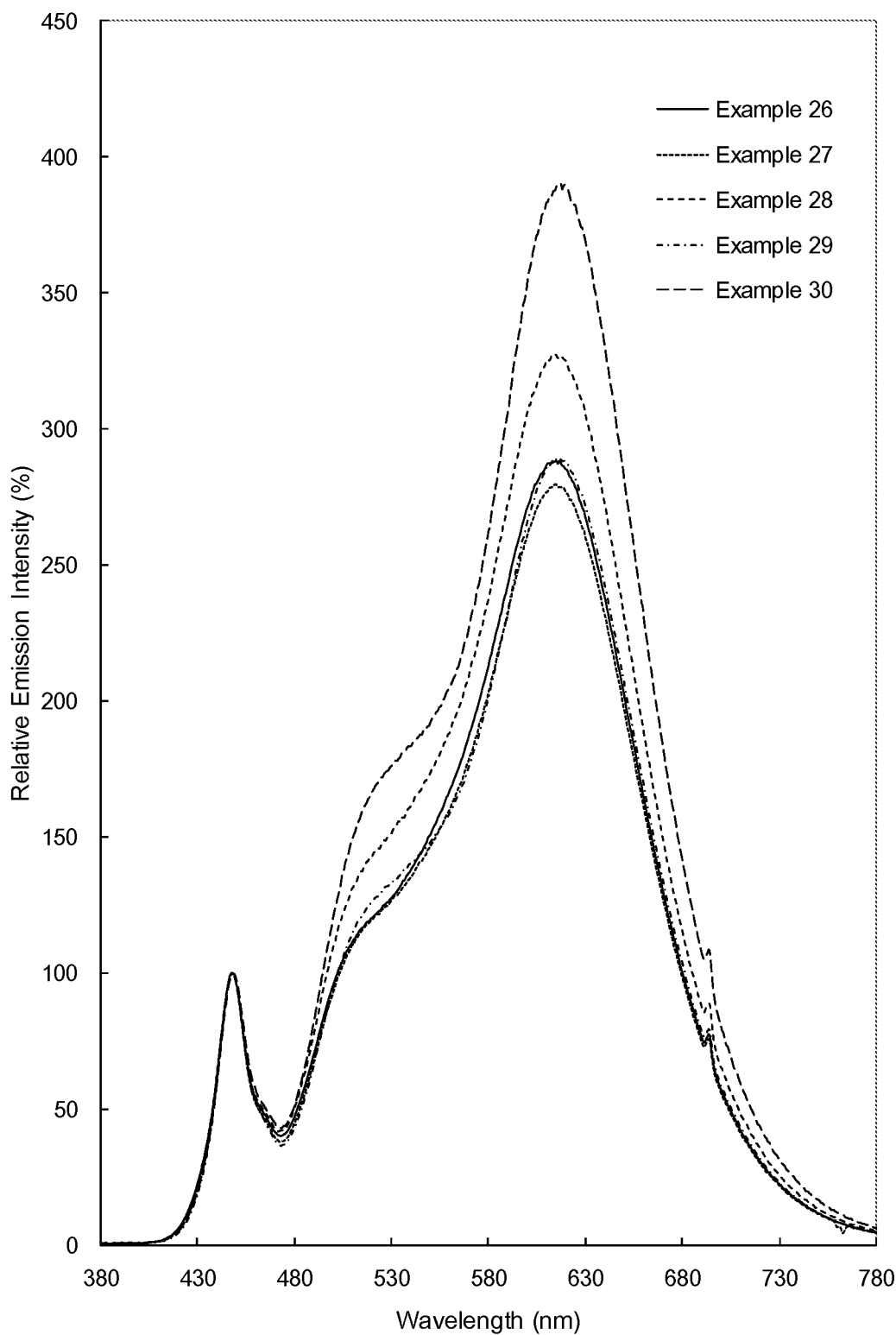
FIG. 15 shows examples of emission spectra of the relative emission intensity to the wavelength, of the light emitting devices according to Examples 26 to 30.

Chromaticity coordinates of emission color, correlated color temperature (Tcp:K), average color rendering index (Ra), special color rendering index (R9), and luminous As shown in Table 13, in Examples 26 to 30, a decrease in luminous efficiency were reduced to smallest possible values with respect to that of Comparative Example 15, and Ra and R9 were increased while maintaining high efficiency. Thus, high efficiencies and high color rendering properties were achieved at the same time. In Examples 26 to 30, the percentage contents of chlorosilicate (first phosphor) that can obtain high color rendering index (Ra≥90) at a correlated color temperature of 2,700 K are in a range of 3.0 to 15.0 mass % with respect to the total content of the phosphors, and in the case where the content of the second phosphor is set to 100, the content ratios of the first phosphor (relative contents of chlorosilicate) with respect to the second phosphor are in a range of 3.3 to 19.9. In the case where the percentage content of chlorosilicate is in a range of 3.0 to 7.5 mass % with respect to the total content of the phosphors, and a relative content of chlorosilicate is in a range of 3.3 to 8.8, high efficiency (relative emission efficiency≥95) can also be satisfied at the same time. FIG. 15 illustrates a comparison of normalized emission spectra of light emitting devices according to Comparative Examples 26 to 30. The emission spectra shown in FIG. 15 show relative emission intensity versus wavelength.

The light emitting devices according to certain embodiments can be used for lighting devices of good emission characteristics with an excitation light source of blue light emitting diode or ultraviolet light emitting diode, for LED displays, flash device for cameras, light source for liquid crystal displays, or the like. In particular, the light emitting devices according to certain embodiments can be used suitably to lighting devices and light sources that are required with high color rendering properties.

Various embodiments of the present disclosure have been shown and described, in which modifications of the above-described configurations may occur and combinations of the components and changes in the orders in the embodiments that can be realized without departing from the scope and technical idea of the present disclosure.

All publications, patent applications, and technical standards mentioned in this specification are herein incorporated by reference to the same extent as if each individual publication, patent application, or technical standard was specifically and individually indicated to be incorporated by reference.

What is claimed is:

1. A light emitting device comprising:
a light emitting element having a peak emission wavelength in a range of 430 nm to 470 nm; and
a fluorescent member comprising:
a first phosphor comprising a silicate has a composition containing at least one element selected from the group consisting of Ca, Sr, and Ba, at least one element selected from the group consisting of Cl, F, and Br, and also containing Mg and Eu;
a second phosphor comprising an aluminate that has a composition containing Lu and Ce; and
a third phosphor having an emission spectrum with a half bandwidth of 86 nm or less and comprising a silicon nitride that has a composition containing at least one of Sr and Ca, and containing Al and Eu.

2. The light emitting device according to claim 1, wherein a percentage content of the first phosphor to a total content of the first phosphor, the second phosphor, and the third phosphor is in a range of 1 mass % to 8 mass %.

3. The light emitting device according to claim 1, wherein a percentage content of the third phosphor to a total content of the first phosphor, the second phosphor, and the third phosphor is in a range of 3.5 mass % to 8 mass %.

4. The light emitting device according to claim 1, wherein a content ratio of the first phosphor to the second phosphor is in a range of 1.5 to 9, when the content of the second phosphor is set to 100.

5. The light emitting device according to claim 1, wherein a content ratio of the first phosphor to the third phosphor is in a range of 25 to 120, when the content of the third phosphor is set to 100.

6. The light emitting device according to claim 1, wherein the third phosphor has an emission spectrum with a half bandwidth of 76 nm or greater.

7. The light emitting device according to claim 1, wherein a peak emission wavelength of the light emitting element is in a range of 445 nm to 455 nm.

8. The light emitting device according to claim 1, wherein the light emitting device is configured to emit light of correlated color temperature in a range of 2,700 K to 5,000 K.

9. The light emitting device according to claim 1, wherein the light emitting device is configured to emit light with an average color rendering index (Ra) of 90 or greater.

10. The light emitting device according to claim 1, wherein the first phosphor has a composition represented by formula (I)

$$(Ca, Sr, Ba)_8MgSi_4O_{16}(F, Cl, Br)_2:Eu \qquad (I).$$

11. The light emitting device according to claim 1, wherein the second phosphor has a composition represented by formula (II)

$$Lu_3Al_5O_{12}:Ce \qquad (II).$$

12. The light emitting device according to claim 1, wherein the third phosphor has a composition represented by formula (III)

$$(Sr, Ca)AlSiN_3:Eu \qquad (III).$$

* * * * *